(12) United States Patent  (10) Patent No.: US 8,438,438 B2
Huang et al.  (45) Date of Patent: May 7, 2013

(54) ENHANCED DIAGNOSIS WITH LIMITED FAILURE CYCLES

(75) Inventors: Yu Huang, Marlborough, MA (US); Wu-Tung Cheng, Lake Oswego, OR (US); Nagesh Tamarapalli, Wilsonville, OR (US); Randy Klingenberg, Wilsonville, OR (US); Janusz Rajski, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 49 days.

(21) Appl. No.: 12/948,460

(22) Filed: Nov. 17, 2010

(65) Prior Publication Data

US 2011/0126064 A1 May 26, 2011

Related U.S. Application Data

(62) Division of application No. 11/510,079, filed on Aug. 25, 2006, now Pat. No. 7,840, 862.

(60) Provisional application No. 60/774,408, filed on Feb. 17, 2006.

(51) Int. Cl.
*G01R 31/28* (2006.01)

(52) U.S. Cl.
USPC ............................ 714/726; 714/729; 714/742

(58) Field of Classification Search .................. 714/726, 714/729, 742
See application file for complete search history.

(56) References Cited

U.S. PATENT DOCUMENTS

| 4,242,751 | A | 12/1980 | Henckels et al. |
| 5,381,421 | A | 1/1995 | Dickol et al. |
| 5,539,652 | A * | 7/1996 | Tegethoff ........................ 703/14 |
| 5,570,376 | A | 10/1996 | Kunda et al. |
| 6,557,129 | B1 | 4/2003 | Rajski et al. |
| 6,829,740 | B2 | 12/2004 | Rajski et al. |
| 6,876,934 | B2 * | 4/2005 | Marlett ........................... 702/58 |
| 7,239,978 | B2 | 7/2007 | Cheng et al. |
| 7,370,254 | B2 | 5/2008 | Rajski et al. |
| 7,729,884 | B2 * | 6/2010 | Huang et al. .................. 702/185 |
| 7,840,862 | B2 * | 11/2010 | Huang et al. .................. 714/726 |
| 2004/0230884 | A1 | 11/2004 | Rajski et al. |
| 2006/0111873 | A1 | 5/2006 | Huang et al. |
| 2007/0100586 | A1 | 5/2007 | Cheng et al. |

OTHER PUBLICATIONS

Liu et al., Efficient Transition Fault ATPG Algorithms Based on Stuck-At Test Vectors, Jun. 20, 2002, Kluwer Academic Publishers, pp. 437-445.*
Huang et al., Diagnosis with Limited Failure Information, 2006, IEEE, pp. 1-10.*
Tegethoff et al., Simulation Techniques for the Manufacturing Test of MCMs, Aug. 23, 1994, Kluwer Academic Publishers, pp. 137-149.*

(Continued)

*Primary Examiner* — John J Tabone, Jr.
(74) *Attorney, Agent, or Firm* — Klarquist Sparkman, LLP

(57) ABSTRACT

Chain or logic diagnosis resolution can be enhanced in the presence of limited failure cycles using embodiments of the various methods, systems, and apparatus described herein. For example, pattern sets can be ordered according to a diagnosis coverage figure, which can be used to measure chain or logic diagnosability of the pattern set. Per-pin based diagnosis techniques can also be used to analyze limited failure data.

20 Claims, 15 Drawing Sheets

OTHER PUBLICATIONS

Balachandran et al., "Correlation of Logical Failures to a Suspect Process Step," *Proc. Int'l Test Conf.*, pp. 458-466 (1999).

Cheng et al., "Compactor Independent Direct Diagnosis," *Asian Test Symposium*, pp. 204-209 (2004).

Crouch, "Debugging and Diagnosing Scan Chains," *EDFAS*, vol. 7, No. 1, pp. 16-24 (published at least as early as Feb. 15, 2005).

Eddleman et al., "Advanced Scan Diagnosis Based Fault Isolation and Defect Identification for Yield Learning," *ISFTA*, 6 pp. (Nov. 6-10, 2005).

Edirisooriya et al., "Diagnosis of Scan Path Failures," *Proc. VLSI Test Symposium*, pp. 250-255 (1995).

Guo and Venkataraman, "A technique for fault diagnosis of defects in scan chains," *International Test Conference*, Paper 10.2, pp. 268-277 (2001).

Huang et al., "Compressed Pattern Diagnosis for Scan Chain Failures," *Proc. Int'l Test Conf.*, 8 pp. (Nov. 8-10, 2005).

Huang et al., "Diagnosing DACS (Defects That Affect Scan Chain and System Logic)," *Int'l Symposium on Testing and Failure Analysis*, pp. 191-196 (2004).

Huang et al., "Efficient Diagnosis for Multiple Intermittent Scan Chain Hold-Time Faults," *Asian Test Symposium*, pp. 44-49 (2003).

Huang et al., "Intermittent Scan Chain Fault Diagnosis Based on Signal Probability Analysis," *Design, Automation, and Test in Europe*, pp. 1072-1077 (2004).

Huang et al., "Statistical diagnosis for intermittent scan chain hold-time fault," *International Test Conference*, Paper 12.2, pp. 319-328 (2003).

Kundu, "Diagnosing Scan Chain Faults," *IEEE Trans. On VLSI Systems*, vol. 2, No. 4, pp. 512-516 (1994).

Narayanan et al., "An Efficient Scheme to Diagnose Scan Chains," *Proc. Int'l Test Conference*, pp. 704-713 (1997).

Rudnick et al., "Diagnostic fault simulation of sequential circuits," *International Test Conference*, Paper 7.1, pp. 178-186 (1992).

Schafer et al., "Partner SRLs for Improved Shift Register Diagnostics," *Proc. VLSI Test Symposium*, pp. 198-201 (1992).

Stanley, "High-Accuracy Flush-and-Scan Software Diagnostic," *IEEE Design & Test of Computers*, pp. 56-62 (Nov.-Dec. 2001).

Wu, "Diagnosis of Scan Chain Failures," *Proc. Int'l Symp. On Defect and Fault Tolerance in VLSI Systems*, pp. 217-222 (1998).

* cited by examiner

```
For (run = 1; run <= 10; run++) { cycle_limit = limit[run];

For (chain = 1; chain <=8; chain++) {

For (cell = 0; cell <=650; cell+=5) { inject one stuck-at-0 at cell on chain;

simulate 500 patterns until fail cycles reach the cycle_limit;

write out truncated fail log;

run chain diagnosis on this fail log
        }
    }
}
```

FIG. 10

ENHANCED DIAGNOSIS WITH LIMITED FAILURE CYCLES

CROSS REFERENCE TO RELATED APPLICATIONS

This application is a divisional of U.S. patent application Ser. No. 11/510,079 (now U.S. Pat. No. 7,840,862), titled "Enhanced Diagnosis with Limited Failure Cycles" and filed Aug. 25, 2006, which claims the benefit of U.S. Provisional Patent Application No. 60/774,408, titled "Enhanced Diagnosis with Limited Failure Cycles" and filed Feb. 17, 2006, both of which are incorporated herein by reference.

FIELD

The disclosed technologies relate to electronic design automation (EDA), and in particular to diagnosing faults in an integrated circuit.

BACKGROUND

Digital circuits are often tested using algorithmically generated test patterns that utilize scan chains to provide stimulus to, and capture responses from, the circuits. Scan-based testing can be a cost effective method to achieve good test coverage with acceptable test time and pattern development overhead.

One concern of scan-based diagnostics can be the shifting of data through the scan chains. The amount of area on a die consumed by the scan flops, scan chain connections, and scan control circuitry can range from 15-30% or more of the die area. Thus, faults in the scan chains themselves are desirably tested through scan chain test and diagnosed through scan chain diagnosis. One concern with scan chain diagnosis, however, is the number of failure cycles that are recorded during diagnosis. For example, for a given chain pattern or scan pattern, a chain defect can sometimes result in about 50% of the flops on a defective chain failing on automated testing equipment (ATE). If the failing flops on good chains (caused by the incorrect loading values from faulty chains) are also counted, the number of failing cycles per pattern can be large. Therefore, improved techniques and tools for properly logging failing patterns for scan chain diagnostics are desired.

SUMMARY

Embodiments of the disclosed technology can be used to enhance chain diagnosis resolution in the presence of limited failure cycles. For example, in some embodiments, pattern sets can be ordered according to a diagnosis coverage figure, which can be used to measure chain diagnosability of the pattern set and which can allow for more effective generation of limited failure data. Further, in some embodiments, per-pin based diagnosis techniques can be used to more effectively analyze limited failure data.

In some embodiments, a method for diagnosing defects in a circuit can comprise receiving failure log data from a test of the circuit, identifying truncated failure data in the failure log data, the truncated failure data being associated with test results captured in one or more scan chains or observed at one or more primary outputs after application of a test pattern during the test, applying a per-pin based diagnosis technique to the truncated failure data to identify one or more fault candidates in the circuit, and storing a list of the fault candidates. In other embodiments, an electronic design system can be configured to perform this method. In further embodiments, a computer-readable medium contains instructions for causing a computer to perform this method. In additional embodiments, a computer-readable medium comprises a list of faulty scan cell candidates determined according to this method. In one embodiment the fault candidate is a faulty scan cell candidate, while in one embodiment the fault candidate is a logic fault candidate. Applying the per-pin based diagnosis technique can further comprise identifying a last observed failure cell of the scan chains or a last observed failure cycle of the primary outputs from the truncated failure data and masking, during simulations performed as part of the per-pin based diagnosis technique, one or more scan cells of the one or more scan chains after the last observed failure cell or one or more cycles from the one or more primary outputs after the last observed failure cycle. Applying the per-pin based diagnosis technique can further comprise identifying from the failure log data a fault type, wherein masking comprises masking the one or more scan cells or primary outputs after the last observed failure cell or last observed failure cycle. One or more fault types can be identified in two or more scan chains or in two or more system logic sections.

In other embodiments, the failure log data indicates a last observed failure cell for the one or more scan chains, the scan chains comprise a last scan cell, and applying the per-pin based diagnosis technique comprises masking one or more scan cells of the scan chains between the last observed failure cell and the last scan cell during simulations performed as part of the per-pin based diagnosis technique. Applying the per-pin based diagnosis technique can further comprise determining a fault range based at least in part on a last-logged failure cycle in the truncated failure data. Determining the fault range can comprise loading the one or more scan chains with at least some masked values during simulations performed as part of the per-pin based diagnosis technique. In other embodiments, faults can be injected into one or more cells of the one or more scan chains during simulations performed as part of the per-pin based diagnosis technique. In additional embodiments, the test of the circuit comprises loading test patterns into the one or more scan chains and applying the test patterns to one or more system logic sections, the test patterns being arranged by a pattern ordering method that orders the test patterns based at least in part on their diagnostic metrics. The pattern ordering method can be applied before the one or more fault candidates are identified. Alternatively, the pattern ordering method can be applied after a faulty scan chain is identified, and the pattern ordering method orders the test patterns based at least in part on their diagnostic coverage of the faulty scan chain. In further embodiments, the pattern ordering method can be applied after one or more faulty scan cells or primary outputs are identified, and the pattern ordering method orders the test patterns based at least in part on their diagnostic coverage of logic fault candidates that explain the one or more faulty scan cells or primary outputs. In other embodiments, the number of failure cycles recorded in the failure log data for a respective test pattern applied during testing can be determined at least in part by user input. In some embodiments, the failure log data can be associated with compressed test responses captured during the test.

In other embodiments, a method for an electronic circuit design (the design comprising one or more scan chains with a plurality of scan cells) comprises: receiving one or more coverage scores for one or more of the scan cells, the coverage scores being associated with one or more scan patterns; determining, according to the one or more coverage scores, a diagnosis coverage figure for the scan chain in relation to the one or more scan patterns; and storing the diagnosis coverage figure. In some embodiments, at least some of the scan patterns are ordered according to their respective diagnosis coverage figures. In some embodiments, the method can further comprise loading at least some of the scan patterns into the one or more scan chains and testing the one or more scan chains using the loaded patterns. In one embodiment, the results of the testing are provided to a per-pin based tester. In another embodiment, the results of the testing are provided to a per-cycle based tester. In additional embodiments, the method can further comprise identifying one or more failing scan chains and thereafter determining one or more diagnostic coverage figures for the failing scan chains. Determining one or more diagnosis coverage figures can comprise averaging two or more of the coverage scores. In further embodiments, the scan chain is a first scan chain with a first plurality of scan cells, the design further comprises a second scan chain with a second plurality of scan cells, the coverage scores are for at least one scan cell of the first plurality of scan cells and at least one scan cell of the second plurality of scan cells, and the diagnosis coverage score is determined for both the first scan chain and the second scan chain.

In yet another embodiment, a method for an electronic circuit design, the design comprising one or more system logic sections, comprises: determining one or more diagnosis coverage figures for one or more test patterns in a set of test patterns, wherein the diagnosis coverage figure is based at least in part on a number of fault pairs in the one or more system logic sections distinguished by the one or more patterns; ordering at least some of the patterns based at least in part on the one or more diagnosis coverage figures; and storing the ordered patterns.

In a further embodiment, a method for diagnosing defects in a circuit comprises: receiving information from multiple tester channels indicative of failing test responses produced by the circuit in response to one or more test patterns, the information including an indication that test response data from one or more of the test channels is truncated for one or more of the test patterns; simulating one or more of the test patterns being loaded into scan chains and applied to system logic sections of the circuit, the simulation comprising modifying values in scan cells associated with the one or more truncated test channels; determining a range of one or more fault candidates based at least in part on the simulation; and storing the range of the one or more fault candidates. In some embodiments at least some of the values are modified based at least in part on a determined fault type. In other embodiments at least some of the values are modified to unknown values. The range can include the last scan cell in a corresponding scan chain. The act of simulating can be repeated with only values within the range modified. A revised range of one or more fault candidates can be determined based at least in part on the repeated simulation and the fault candidates from the revised range can be stored. The information received can comprise a pin-based failure log. In one embodiment, a computer-readable medium comprises computer-executable instructions for causing a computer to perform this method. In another embodiment, a diagnostic system is configured to perform this method.

In an additional embodiment, a method for diagnosing defects in one or more scan chains of a circuit, the scan chains respectively comprising one or more scan cells, comprises: receiving failure log data from a test of the circuit; identifying truncated failure data in the failure log data, the truncated failure data being associated with test results captured in one or more scan chains after application of a test pattern during test; applying a per-pin based diagnosis technique to the truncated failure data to identify one or more faulty scan cell candidates in the scan cell chains; and storing a list of the faulty scan cell candidates.

The foregoing and other objects, features, and advantages of the technology will become more apparent from the following detailed description, which proceeds with reference to the accompanying figures.

BRIEF DESCRIPTION OF THE DRAWINGS

FIG. 10 is exemplary pseudocode showing an exemplary diagnosis method that was used to produce some of the experimental results reported in this disclosure.

DETAILED DESCRIPTION

General Considerations

Figure 1:
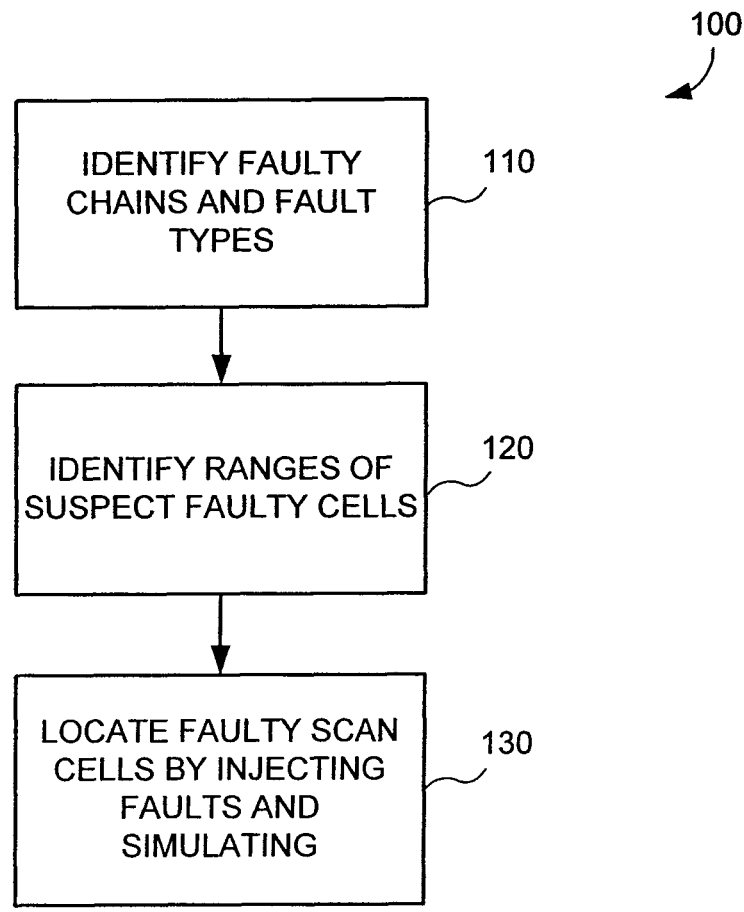
FIG. 1 shows an exemplary software-based chain diagnosis method.

Disclosed herein are exemplary embodiments of methods, apparatus, and systems for performing fault diagnostics or enhancing fault diagnostics that should not be construed as limiting in any way. Instead, the present disclosure is directed toward all novel and nonobvious features and aspects of the various disclosed methods, apparatus, and systems, alone and in various combinations and subcombinations with one another. The disclosed technology is not limited to any specific aspect or feature described, or combination thereof, nor do the disclosed methods, apparatus, and systems require that any one or more specific advantages be present or problems be solved. Moreover, any of the methods, apparatus, and systems described herein can be used in connection with a wide variety of scan-based or partially-scan-based circuits.

Although the operations of some of the disclosed methods are described in a particular, sequential order for convenient presentation, it should be understood that this manner of description encompasses rearrangement, unless a particular ordering is required by specific language set forth below. For example, operations described sequentially may be rearranged or performed concurrently.

The disclosed embodiments can be implemented in a wide variety of environments. For example, the disclosed analysis techniques can be implemented as software comprising computer-executable instructions stored on computer-readable media (for example, one or more CDs, volatile memory components (such as DRAM or SRAM), or nonvolatile memory components (such as hard drives)). Such software may comprise, for example, electronic design automation (EDA) software used to control testing and to diagnose test responses during production testing of one or more integrated circuits (for example, application specific integrated circuits (ASICs), programmable logic devices (PLDs) such as field-programmable gate arrays (FPGAs), or a systems-on-a-chip (SoCs), any of which can have digital, analog, or mixed-signal components thereon). This particular software implementation should not be construed as limiting in any way, however, as the principles disclosed herein are generally applicable to other software tools. Circuit faults that are detected in part using the disclosed techniques may in some circumstances be repaired.

Any such software can be executed on a single computer or on a networked computer (for example, via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware for executing the software implementations is not described in further detail. Any of the disclosed methods can alternatively be implemented (partially or completely) in hardware (for example, an ASIC, PLD, or SoC).

Furthermore, diagnostic results produced from any of the disclosed methods can be created, updated, or stored on computer-readable media, volatile memory components, or nonvolatile memory components using a variety of different data structures or formats. For example, a list comprising faulty scan cell candidates produced by the application of any of the disclosed embodiments may be stored on computer readable-media. Such diagnostic results can be created or updated at a local computer or over a network (e.g., by a server computer). As used herein, the term "list" refers to a collection or arrangement of data that is usable by a computer system. A list may be, for example, a data structure or combination of data structures (such as a queue, stack, array, linked list, heap, or tree) that organizes data for better processing efficiency, or any other structured logical or physical representation of data in a computer system or computer-readable media (such as a table used in a relational database).

Moreover, any of the disclosed methods can be used in a computer simulation or other EDA environment, where test patterns, test responses, and compressed or uncompressed fail sets are determined or otherwise analyzed using representations of circuits, which are stored on one or more computer-readable media. For presentation purposes, the present disclosure sometimes refers to a circuit or circuit component by its physical counterpart (for example, scan chain, scan cell, and other such terms). It should be understood, however, that any reference in the disclosure or the claims to a physical component includes both the physical component and representation of the physical component as used in simulation or other such EDA environments.

Embodiments of the disclosed technology address at least some challenges associated with diagnosing chain integrity failures and system logic failures from standard production test patterns using a limited number of failure cycles.

Introduction to the Disclosed Technology

Scan-based testing can open new possibilities for the failure analyst. Scan diagnostics can be utilized, for example, at the wafer sorting stage or final test stage without consideration of packaging, backside die access, or multi-level metal stacks that sometimes limit traditional diagnosis techniques. Advances in scan diagnostics have led to tools capable of identifying the defect types (such as bridges or opens) as well as identifying the potential defect location on the die. Scan-based diagnostic results have also been merged with in-fab particle data to help identify defects without performing failure analysis. These advances have helped scan diagnostics move from the failure analysis lab into the volume production yield enhancement domain.

One difference between the volume production and failure analysis lab environment is the number of failing patterns/cycles that can be logged. In a failure analysis lab, for example, it can be possible to collect many more failure cycles during a test than in the volume production environment. This can be done, for example, by iteratively applying the patterns and collecting failures from a sliding window that captures a full buffer worth of failures. The resulting failure logs for different subsets of patterns can be merged later for diagnosis. In the volume production environment, however, this is generally not practical because of the enormous time penalty. Therefore, the total number of failing patterns/cycles is usually limited by the ATE fail buffer capacity and test time target. Further, diagnostic resolution can be directly related to the number of failing patterns/cycles logged. Consequently, a limited number of failing patterns/cycles will typically have a negative impact on the diagnostic resolution. The negative impact from the limited number of failing patterns can be especially pronounced in scan chain defect diagnosis.

As mentioned above, one concern of scan-based diagnostics can be the shifting of data through the scan chains. The quantity of die failing a scan chain integrity test will typically scale proportionally with the percentage of total circuitry in the scan shift path. One aspect of scan chain diagnosis is the number of failure cycles required to properly diagnose chain failures. One chain defect can sometimes cause many flops on a defective chain to fail. Consider, for example, a faulty chain that has 10,000 flops. A fail log of over 25,000 cycles may result if 5 failing patterns are logged. Collecting this magnitude of data in the failure analysis lab may take minutes to hours depending on the test platform used. In the volume production test environment, however, it is likely that the fail log will not even collect all the failing cycles for one pattern, making chain diagnosis difficult, if not impossible. Therefore, properly logging failing patterns for scan chain diagnostics has traditionally been a challenge for a single failing die in a failure analysis lab and can be practically infeasible during production testing in a volume mode.

In general, system logic diagnosis does not suffer from the same problem as scan chain diagnosis. Sometimes, however, logic defects can produce many more failure cycles on some specific pins than other pins. In such an instance, the number of failure patterns that can be logged may also be limited. Although aspects of the disclosed technology are described with particular reference to diagnosing scan chain defects, this application should not be construed as limiting, as the technology can be applied to defect diagnosis in the system logic as well.

Among the various methods described herein are exemplary methods for enhancing diagnostic resolution using normal production test patterns and a limited number of failure cycles. Embodiments of the disclosed methods can also be applied in the failure analysis lab environment, for example, to save some efforts logging large numbers of failure cycles and enhance the diagnosis resolution. Certain embodiments of the disclosed technology can be applied in the volume production environment and can make scan chain diagnosis feasible. The ability to perform scan chain diagnosis in a volume production environment from a small number of failure cycles can be particularly desirable.

Overview of Circuit Diagnosis

In general, integrated circuit manufacturing tests involve two distinct test phases. The first test phase is typically known as "chain test" or "chain testing." The purpose of chain testing is to determine whether the scan chains of a circuit-under-test work as expected. When compression techniques are used, chain testing desirably tests the decompressor and compactor logic in addition to the scan chains. If the chain test is passed, it is usually assumed that the scan chains (as well as the decompressor/compactor logic) will work and testing proceeds to the second test phase, which is termed "scan test" or "scan testing" for purposes of this disclosure. The purpose of scan testing is, to determine whether there are any faults in the system logic. When a scan test fails, a failure analysis procedure can be performed (e.g., automatically performed) and the root cause of a failure determined.

As noted above, effective failure analysis can improve integrated circuit manufacturing in a variety of ways. For example, failure analysis can be used to learn about and improve the manufacturing yield whenever a new technology is introduced. For instance, failure analysis can help identify systemic manufacturing issues that impact yield. The results of diagnosis typically include a report identifying the suspect sites (sometimes referred to herein as "fault suspects" or "fault candidates"). The suspect sites of the integrated circuit can then be evaluated using devices such as scanning electron microscopes ("SEMs").

In general, there are two types of fault diagnosis. If the chain test fails, "chain diagnosis" is performed to locate which scan chain(s) and/or scan cell(s) have or likely have defects. If the chain test is passed but the scan test fails, "logic diagnosis" (also referred to as "scan diagnosis") is performed to identify the suspect fault sites that best explain the failures. Typically, chain diagnosis involves application of both chain pattern and scan patterns, whereas logic diagnosis typically involves applying only scan patterns. A chain pattern can be characterized as a test pattern that is used to test the scan cells of a scan chain. A chain pattern is ordinarily applied by shifting the pattern into and out of the scan chains while the scan chain is continuously operated in scan mode (that is, the scan chains are not operated in a normal mode in which the circuit's response to the test pattern is captured in the scan cells of the scan chain). Thus, a chain pattern tests the scan cells and the paths and logic associated with the scan cells rather than the functional logic of the circuit-under-test. A scan pattern, by contrast, can be characterized as a test pattern that is used to test the operational logic of the circuit-under-test. In operation, a scan pattern is typically loaded into the scan chains during a shift phase. The circuit-under-test is then operated in a normal mode using the test patterns for input values. The circuit-under-test can be clocked for a designated period of time (e.g., one clock cycle for traditional stuck-at test patterns or multiple clock cycles for at-speed or other sequential test patterns) after which the circuit response to the test pattern (the "test response") is captured and stored in the scan chains. With the circuit again in scan mode, the test response is clocked out of the scan chains and into the compactor (if embedded compression hardware is used).

For the purposes of this application and the accompanying claims, system logic can comprise one or more system logic sections. Values can be read from the sections using the scan cells of the scan chains and one more primary outputs (POs) associated with the logic sections. In some embodiments, during logic testing both traditional test patterns and at-speed test patterns can be used.

Overview of Chain Diagnosis

Chain diagnosis techniques can be generally classified into two categories. The first category is hardware-based chain diagnosis, which uses special scan cells and/or additional scan circuitry. The second category is software-based chain diagnosis. The hardware-based methods typically use some special scan chain design to facilitate the scan chain diagnosis process. Embodiments of the disclosed technology typically do not use any special hardware because such hardware ordinarily prevents diagnosis from being applied in the volume production environment.

The software-based techniques typically do not involve any modification of the basic scan circuitry, though some embodiments can involve such modification. With embedded compression hardware, the chain diagnosis technique can be modified to incorporate the compactor function. See, e.g., U.S. Published Patent Application No. 2006/0111873, which is hereby incorporated herein by reference. Compared with hardware-based methods, software-based techniques are generally more attractive due to the usual lack of design modifications.

An exemplary software-based chain diagnosis method 100, as can be used in connection with embodiments of the disclosed technology, is shown in FIG. 1. As an example for illustrating this method, an exemplary design is assumed that has one defective scan chain composed of 12 scan cells numbered from cell 0 to cell 11, where cell 0 is connected to the scan chain output and cell 11 is connected to the scan chain input.

In method act 110, faulty chains and fault types are identified using, for example, chain integrity test patterns. For example, the faulty scan chain can be loaded with a chain pattern "001100110011," where the leftmost bit is loaded into cell 11 and the rightmost bit is loaded into cell 0. If the failing cycles are observed at cells 2, 3, 6, 7, 10 and 11 on this chain, it can be determined that there is at least one stuck-at-1 fault on the defective chain.

In method act 120, one or more ranges of suspect faulty cells can be identified using system logic test patterns. For instance, a so-called "full-masked" method can be used. According to some embodiments of a full-masked method, a test pattern can be modified by setting the load values of the scan cells on the faulty scan chain(s) to "X"s. (In some embodiments, each test pattern can be modified by setting the load values of all the scan cells on the faulty scan chain(s) to "X"s.) A good machine simulation is then performed based on the modified patterns. If there are some known values captured in the faulty chain after simulation, the bounds of where the faulty cell is loaded in the faulty chain can be determined based on these known values and the corresponding observed values. For example, in a case where a permanent stuck-at-1 fault exists on the defective scan chain in the above example, a scan test pattern "011000110001" can be loaded into the scan cells on the faulty chain. According to one embodiment of the full-masked method, the loaded values for this faulty chain can be changed to "XXXXXXXXXXXX" for good machine simulation. After the good machine simulation, the captured value on the faulty chain is, for example, "X10XX01X10XX." Because the loaded "X"s masked the faulty cells, the captured known values ("1"s and "0"s) are correctly captured into the faulty scan chain regardless of whether the loaded values are faulty or not. If the observed unloaded value at scan cell 9 (simulated capture value is "0") is incorrect (observed a "1"), the permanent stuck-at-1 fault can be determined to be downstream of cell 9 (that is, located in cell 9 or lower). In other words, cell 9 can be determined to be an upper bound of the faulty cell. Also, if the observed unloaded value at scan cell 6 (simulated capture value is "0") is correct (observed a "0"), the fault can be determined to be upstream of cell 6 (that is, located in cell 6 or higher). In other words, cell 6 can be determined to be a lower bound of the faulty cell. Therefore, the range of the stuck-at-1 fault is from cell 6 to 9, or: [6, 9].

In other embodiments, an iterative partial-masked method can alternatively be used in order to enhance the range calculation. For instance, still using the previous example, after it is determined that the fault is down stream of cell 9, a pattern's loading values can be set on the faulty chain to "X" only from cell 9 to cell 0. In this way, the chances of capturing more known values after cell 9 are increased and more useful information for chain diagnosis can be obtained. This procedure can be iteratively repeated using one or more revised ranges until the range of fault cannot be narrowed down further using this technique or until the faulty scan cell is identified.

In method act 130, faulty scan cells or scan cell candidates can be located. This can be performed by "injecting" faults at suspect cells within the identified range(s) and simulating the scan patterns. For example, a fault can be injected in a software simulation environment on a scan cell within the range determined in the above act. Loading values in the scan cells downstream of this scan cell on the faulty chain will consequently be modified for scan patterns due to the fault. In one example, a scan pattern has a good machine loading value of "001110011010" on the faulty chain. If a stuck-at-1 fault is injected on scan cell 3 of this chain, the loading value will be modified to "001110011111." After pulsing the capture clock, the captured values in the scan cells upstream of the faulty scan cell on this faulty chain will be modified. For example, if the simulated captured value is "101011101011," the unloading values will be "111111111011." The simulation results can be compared with the observed results from ATE and one or more of the best matching cell(s) can be identified and reported as suspect(s). For example, the cells can be stored in a list or data structure comprising scan cell candidates.

Chain Diagnosis with Limited Failure Information, Generally

When a tester fail buffer is limited or the test time is constrained, it can be desirable to consider failure cycle logging efficiency. For example, logging those failure cycles that are more beneficial to improving diagnostic resolution can be preferable to logging failure cycles that contain redundant information.

For example, in a given set of chain integrity test patterns, it can be observed that a large amount of redundant failure information exists if all failure cycles from the chain patterns are logged. In one example, a chain has 10,000 scan cells, and a stuck-at-0 fault is on this chain. Assuming only one chain pattern "00110011 . . . 0011", this chain pattern has 5000 failed cycles at cells 0, 1, 4, 5, . . . 9996, 9997. If just the first few failure cycles were logged, it could be determined that there existed a stuck-at-0 fault on this chain. Accordingly, to improve the failure logging efficiency of chain diagnosis, only a small subset of all failure cycles for chain patterns can be logged. This can be achieved, for example, by masking the chain pattern expected values to "X" at those cells that are not to be logged. In exemplary embodiments of the disclosed technology, the number of logged cycles can be set by the user. For a "00110011 . . . " chain pattern, for instance, a user could select to observe at least 6 cycles in order to include 0, 1, 1→0, and 0→1 transitions. Consequently, stuck-at-1, stuck-at-0 and shift timing errors could be covered. In other embodiments, the number of logged cycles can be preset (for example, on a per-pin basis).

In the following subsections, exemplary embodiments for logging failure cycles in scan patterns using a typical chain diagnosis technique (such as the exemplary technique described above) are disclosed. The exemplary embodiments can be used, for example, to enhance chain diagnosis resolution in the presence of limited failure cycles. The described technologies can be used with various fault models, such as stuck-at-1, stuck-at-0, slow-to-rise, slow-to-fall, slow, fast-to-rise, fast-to-fall, fast, and indeterminate. Some embodiments can support all of these models, while other embodiments support only a subset of these models.

Pattern Ordering

In some embodiments, it is not unusual for different production scan patterns in one or more scan pattern sets to provide different degrees of fault coverage. Accordingly, it can be helpful to apply to one or more scan chains one or more patterns with relatively high degrees of fault coverage before applying one or more patterns with lower degrees of fault coverage.

Some production pattern sets are ordered to put one or more patterns with higher degrees of coverage at the beginning of a test. This method of ordering can result in lower test time and higher fault coverage should results from the pattern set need to be truncated to fit into available memory space. However, this order of production patterns may not be good for chain diagnosis. To help describe a pattern's usefulness for chain diagnosis, a measure termed "diagnosis coverage" can be used. Diagnosis coverage is discussed in more detail below.

Given a scan pattern set, it can be desirable to predict the general chain diagnosis capability of patterns in the set and of the pattern set as a whole. For example, it can be known that there is a fault on one defective chain, although the exact location of the fault is not necessarily known. A scan pattern can be modified to mask its loading values on this chain to all "X"s (full-masked) due to the lost controllability. After pulsing the capture clock, this pattern probably captures some known values ("0" or "1") back to the faulty chain. These known values can be used to cut the faulty chain into segments. Based on the observed values, a determination can be made as to what segment the fault is located in (as described above, for example). In general, as more known values are captured by masked patterns, more useful information can be obtained for chain diagnosis. As noted above, the concept of full-masked patterns can be extended to partial-masked patterns. Diagnosis coverage can be calculated based on both full-masked and partial masked patterns.

In some embodiments with embedded compression hardware, the described techniques can still be applicable when the cycle that captured a known value is not masked by an "X" captured at the same cycle on other chains that, connect to the same compactor channel output.

Based on the above descriptions, the following definitions can be established:

A scan cell can be designated as "full-0-covered" by a pattern set if there exists at least one pattern in the pattern set such that its full-masked version captures a "0" at this cell and this cycle is not masked by an "X" during compaction.

A scan cell can be designated as "full-1-covered" by a pattern set if there exists at least one pattern in the pattern set such that its full-masked version captures a "1" at this cell and this cycle is not masked by an "X" during compaction.

A scan cell can be designated as "full-covered" by a pattern set, if it is "full-0-covered" and "full-1-covered."

A scan cell can be designated as "partial-0-covered" by a pattern set if there exists at least one pattern in the pattern set such that at least one of its partial-masked versions captures a "0" at this cell and this cycle is not masked by an "X" during compaction.

A scan cell can be designated as "partial-1-covered" by a pattern set if there exists at least one pattern in this pattern set such that at least one of its partial-masked versions captures a "1" at this cell and this cycle is not masked by an "X" during compaction.

A scan cell can be designated as "partial-covered" by a pattern set if the scan cell is "partial-0-covered" and "partial-1-covered."

Given a pattern set, a score $S_i$ can be assigned to a scan cell i based on an exemplary method using the above definitions. In some embodiments, a score $S_i$ is assigned to a scan cell i for a given pattern set as follows:

if scan cell i is full-covered, then $S_i=1.0$;
if scan cell i is full-0-covered, full-1-covered or partial-covered, then $S_i=0.5$;
if scan cell i is partial-0-covered or partial-1-covered, then $S_i=0.25$;
otherwise, $S_i=0$.

Other values and methodologies can be used to assigned the scores. Unless otherwise stated, scores for scan cells in this application are assigned as explained above.

The figure Diag_Coverage can be used to measure chain diagnosability for a given pattern or pattern set. In some embodiments, Diag_Coverage can be calculated as an average of the $S_i$ scores for a given number of scan cells, as shown in Formula 1:

$$\text{Diag\_Coverage} = \Sigma_{(i \in cells)}(S_i)/(\# \text{ of cells}) \quad (1)$$

Generally, the larger the value of Diag_Coverage, the greater the chance of accurate chain diagnosis with good resolution for defects in the chain(s) containing the scan cells. Scan patterns in a scan pattern set can be ordered at least in part according to values of Diag_Coverage for the patterns.

Figure 2:
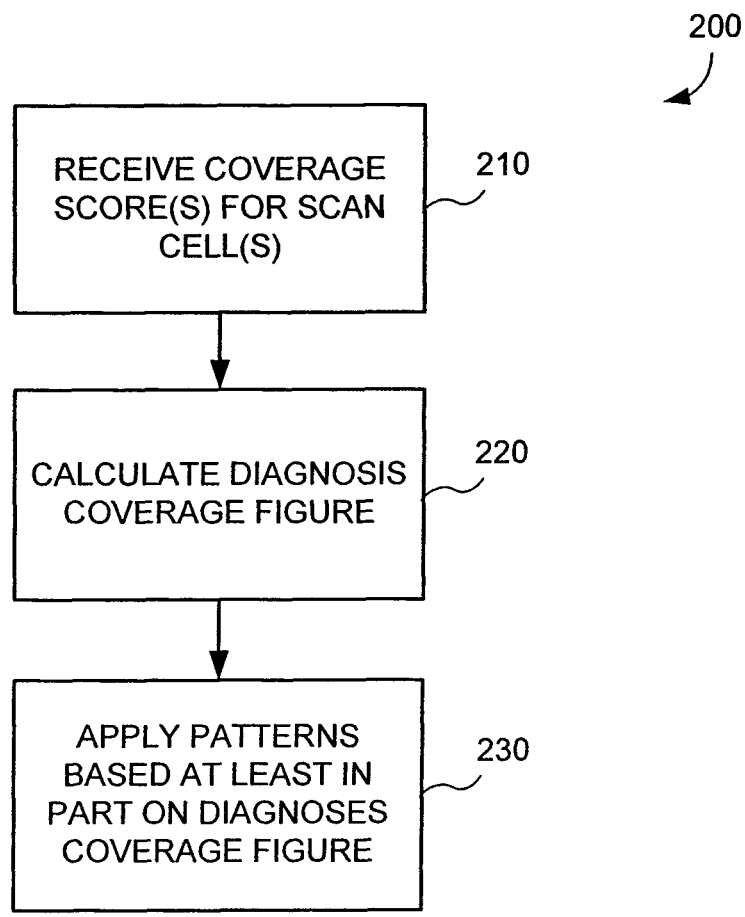
FIG. 2 shows a first exemplary method of ordering production scan patterns.

FIG. 2 shows one exemplary method 200 of ordering production scan patterns. The method 200 can comprise receiving coverage scores for one or more patterns with respect to one or more scan cells (method act 210). In some embodiments, "receiving coverage scores" can comprise assigning scores using a methodology similar to that described above, while in other embodiments the scores can be simply provided (e.g., to an EDA tool), having been assigned beforehand. The scores can be used to calculate a diagnosis coverage figure (method act 220) with respect to one or more scan chains. This can be done using, for example, a formula such as Formula 1. In further embodiments, one or more scan chains can be tested using one or more patterns, the patterns being applied to the scan chains in an order based at least in part on one or more diagnoses coverage figures (method, act 230).

Figure 3:
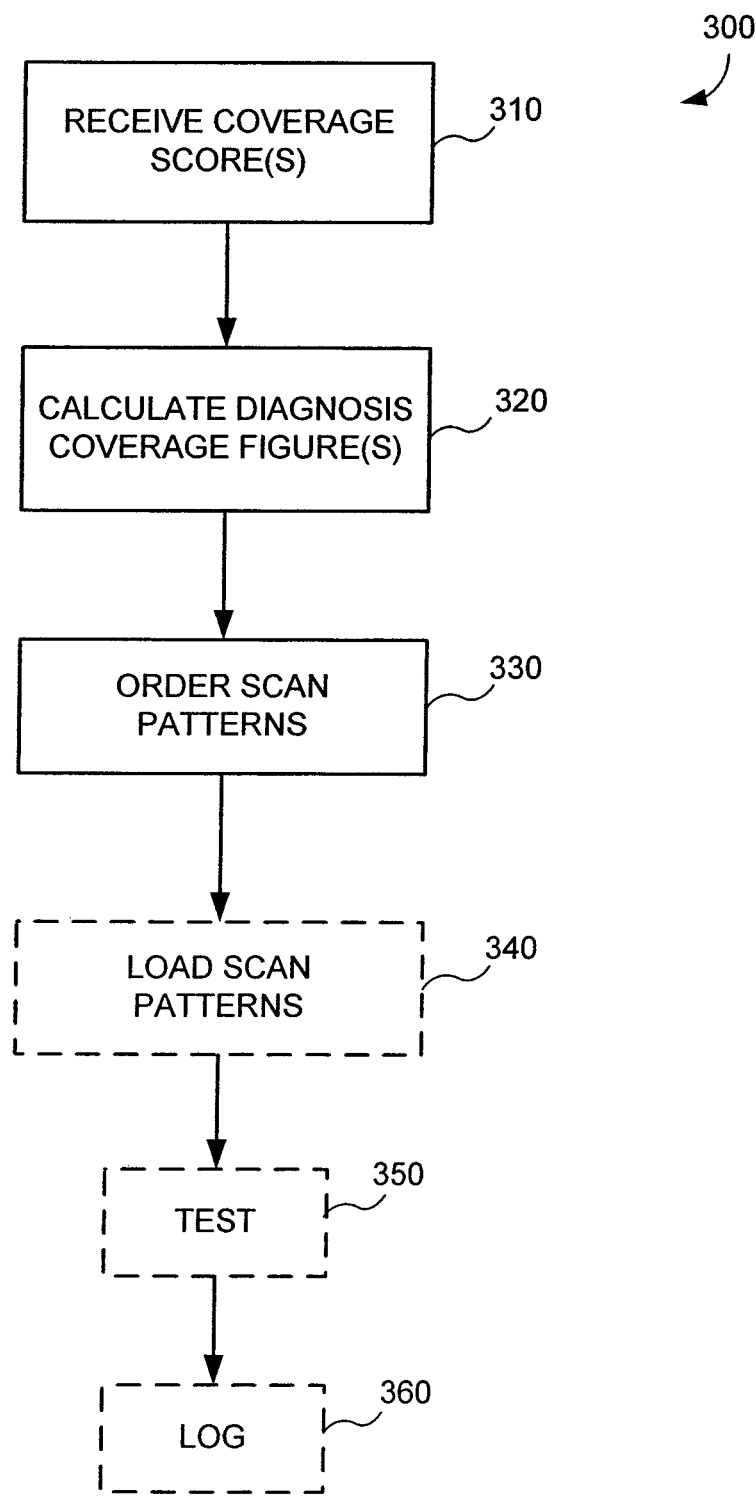
FIG. 3 shows a second exemplary method of ordering production scan patterns.

FIG. 3 shows one exemplary method 300 of ordering production scan patterns, which is a further embodiment of method 200. In this embodiment, one or more coverage scores for one or more scan cells are received (method act 310) and one or more diagnosis coverage figures are calculated (method act 320). Based on the diagnosis coverage figures, the scan patterns in the pattern set can be ordered (method act 330). For instance, in particular embodiments, the patterns can be ordered in descending order or substantially descending order. One or more scan patterns can be loaded into one or more scan chains (method act 340) in order to test the scan chains (method act 350). Test results can be stored in a log (method act 360). The method 300 is referred to herein as "static" pattern ordering. In these and similar embodiments, the ordered scan pattern set can improve the failure logging efficiency and potentially enhance the diagnosis resolution. Experimental results using such an exemplary method under a fixed cycle limit are described below.

Figure 4:
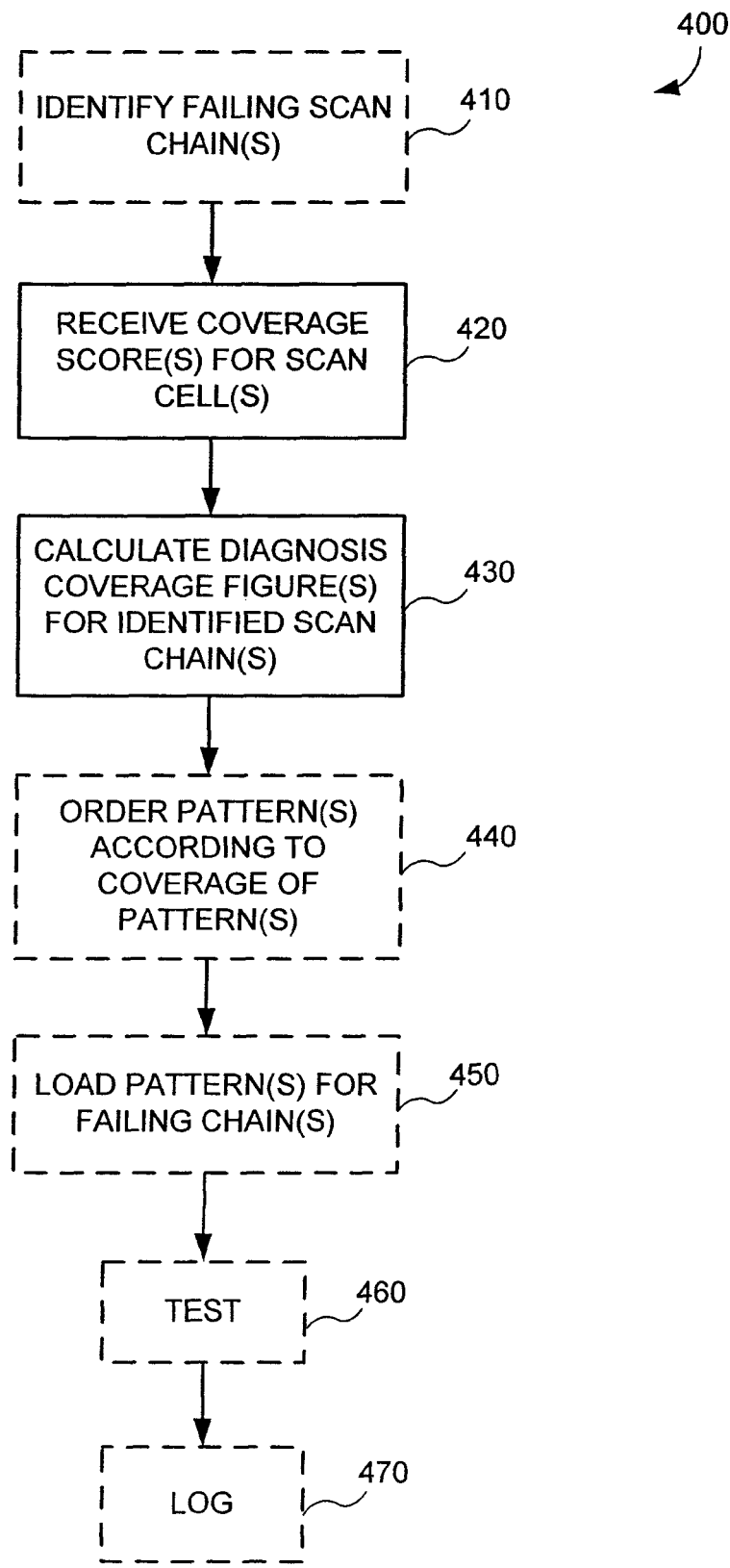
FIG. 4 shows a third exemplary method of ordering production scan patterns.

FIG. 4 shows an exemplary method 400 of ordering production scan patterns, the method being a further embodiment of method 200. In this embodiment, one or more coverage scores for one or more scan cells are received (method act 420) and one or more diagnosis coverage figures are calculated for selected scan chains (method act 430). Generally, in this method a particular diagnosis coverage figure is calculated using coverage scores from cells in one chain (whereas in the method 300 a single diagnosis coverage figure can be calculated using coverage scores from one chain or from several chains). These scan chains can be chains that have been identified as failing by one or more tests (method act 410), e.g., by chain integrity tests. Diagnosis coverage figures can indicate a degree of diagnosability of a pattern for a given chain. Patterns in a pattern set can be ordered according to diagnosis coverage figures for the patterns (method act 440). For instance, in particular embodiments, the patterns can be ordered in descending order or substantially descending order. Thus the patterns can be ordered such that patterns with relatively high diagnosabilities for a given scan chain are loaded into a failing scan chain before patterns with relatively low diagnosabilities for the scan chain (method act 450). The scan chains can then be tested using one or more of the patterns (method act 460), and the test results can be logged (method act 470). The method 400 is referred to herein as "dynamic" pattern ordering.

Table 1 shows an example of diagnosis coverage figures for patterns 0 through 7 as applied to three scan chains, chain1, chain2 and chain3. The last row of Table 1 contains a dynamic pattern order for each of the respective chains. In this embodiment, the patterns are ordered in descending order of diagnosability coverage. Data such as that shown in Table 1 can be stored in, for example, a look-up table (LUT) implemented in hardware or software.

In the depicted embodiment, pattern 4 is a reset pattern. It is not unusual for a reset pattern to provide a high diagnosis coverage, as reset patterns typically initialize a large number of cells to known values, independent of load values. In production testing, the reset pattern may not be the first pattern applied. However, for chain diagnosis purposes, having a reset pattern at the beginning of a scan pattern set can be desirable.

TABLE 1

An exemplary embodiment of diagnosis coverage figures for dynamic pattern ordering

|  | Chain 1 | Chain 2 | Chain 3 |
|---|---|---|---|
| Pattern 0 | 0.1 | 0.2 | 0.2 |
| Pattern 1 | 0.2 | 0.04 | 0.2 |
| Pattern 2 | 0.1 | 0.01 | 0.2 |
| Pattern 3 | 0.1 | 0.12 | 0.2 |
| Pattern 4 | 0.5 | 0.5 | 0.5 |
| Pattern 5 | 0.05 | 0.25 | 0.1 |
| Pattern 6 | 0.3 | 0.13 | 0.1 |

TABLE 1-continued

An exemplary embodiment of diagnosis coverage figures
for dynamic pattern ordering

|  | Chain 1 | Chain 2 | Chain 3 |
|---|---|---|---|
| Pattern 7 | 0.15 | 0.05 | 0.1 |
| Dynamic Patterns | 4, 6, 1, 7, | 4, 5, 0, 6, | 4, 0, 1, 2 |
| Orders | 0, 2, 3, 5 | 3, 7, 1, 2 | 3, 5, 6, 7 |

As an example using the data of Table 1, if chain patterns indicate that chain 3 has one or more failures, the following dynamic pattern ordering can be applied for testing chain 3: Patterns 4, 0, 1, 2, 3, 5, 6 and 7.

In some embodiments, pattern ordering can also be applied to logic diagnosis. For example, for static pattern ordering the figure Diag_Coverage can be used to measure logic diagnosability for a given scan pattern applied to logic in a circuit or in a section of a circuit. In some embodiments, Diag_Coverage can be calculated as a fraction of fault pairs distinguished by pattern P out of a total number of fault pairs, as shown in Formula 2:

$$\text{Diag\_Coverage}(P) = \frac{\text{number of fault pairs distinguished by pattern } P}{\text{total number of fault pairs in circuit}} \quad (2)$$

One or more scan patterns in a pattern set can be ordered according to Diag_Coverage figures of the patterns (e.g., in descending order) and then applied to the circuit or section of the circuit. Diagnosis resolution can be enhanced using a pattern set ordered in this manner.

Dynamic pattern ordering (based, for example, on the figure Diag_Coverage) can also be used to measure logic diagnosability for a given scan pattern set applied to logic in a circuit or in a section of a circuit. For example, Diag_Coverage can be calculated as a number of suspect fault pairs distinguished by a pattern P out of a total number of suspect fault pairs, as shown in Formula 3:

$$\text{Diag\_Coverage}(P) = \frac{\text{number of suspect fault pairs distinguished by pattern } P}{\text{total number of suspect fault pairs in circuit}} \quad (3)$$

Initially, all faults can be assumed to be suspect faults. If this assumption is made, the Diag_Coverage values produced by Formulas 2 and 3 are the same for a given pattern. After one or more patterns are applied to the logic, preliminary diagnostic techniques can be applied to narrow down one or more suspected faults. When a list of suspect faults is narrowed, Diag_Coverage can be recalculated for one or more patterns (e.g., patterns that have not yet been applied to the logic). This process can be repeated (e.g., until a fail buffer limit is reached, or until a particular diagnostic resolution is obtained).

The values of Diag_Coverage calculated using Formulas 1, 2 and 3 (as well as similar formulas) are sometimes referred to in this application and in the claims as "diagnosis metrics."

The phrase "pattern reordering" can sometimes be used interchangeably with "pattern ordering," although "pattern reordering" does not necessarily imply that a set of one or more patterns previously had a particular order.

Dynamically ordering the scan pattern set can improve the failure logging efficiency and thereby enhance the diagnosis resolution. Experimental results from using an exemplary embodiment of the dynamic pattern ordering technique under a fixed cycle limit are discussed below.

Per-Pin Based Diagnosis

When applying scan patterns in the presence of a chain defect, the faulty chain or chains can typically produce many more failure cycles than the good chains or primary outputs (POs). The information that can be determined from the failure cycles collected from faulty chains, however, is often redundant. By contrast, the less frequent failures observed in good chains or POs typically provide more useful information for diagnostic purposes. (This observation is similar to the concept of entropy in information theory where events that happen less frequently will typically contain more useful information.) Accordingly, in certain embodiments of the disclosed technology, failure cycle information distributions are considered and used to improve diagnosis resolution.

In diagnostic software tools implementing the disclosed technology, multiple testers can be supported. For example, in some embodiments, two formats of testers are supported: per-cycle-based and per-pin-based (sometimes referred to as pattern-based).

Figure 5:
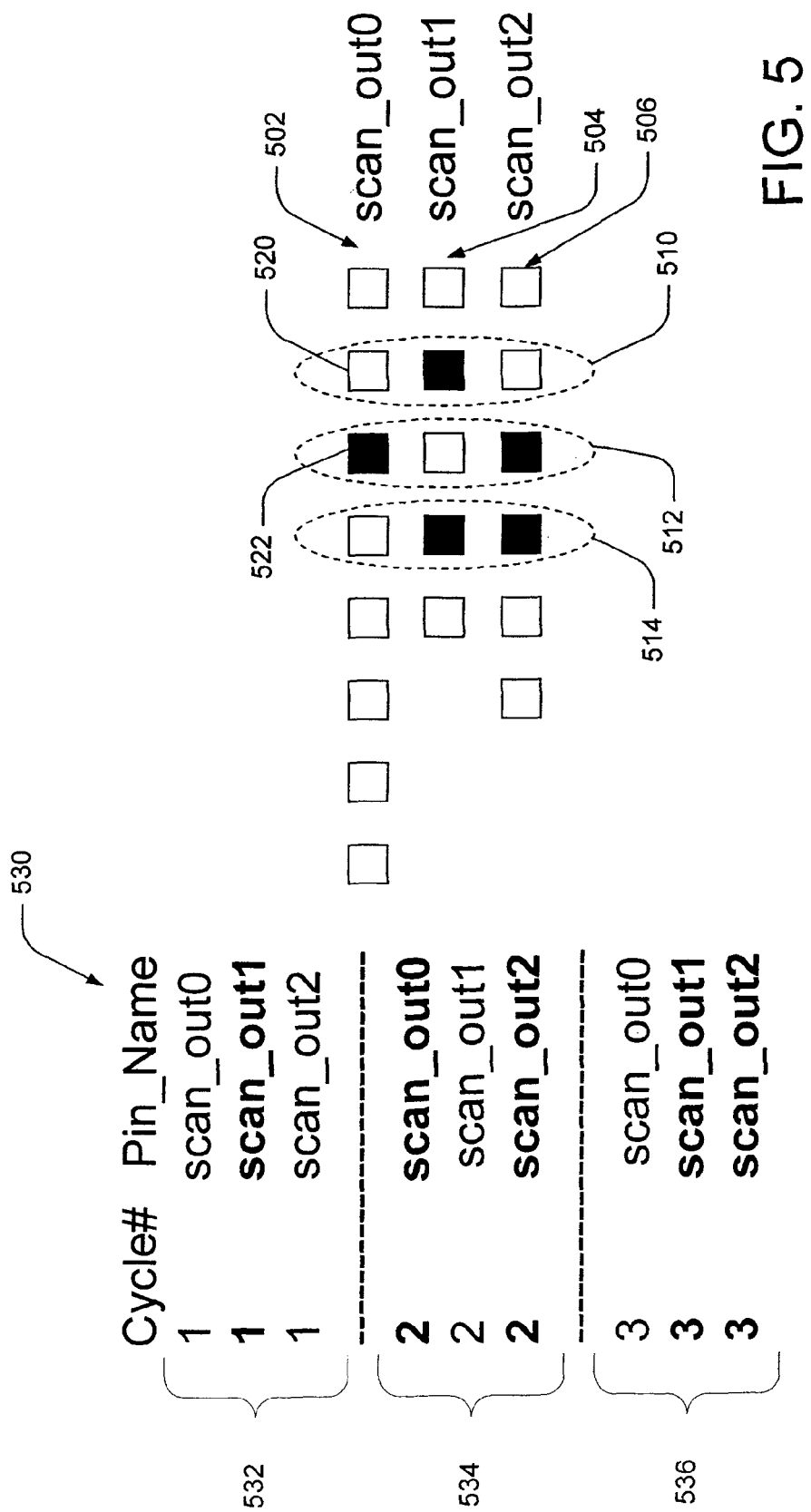
FIG. 5 shows an example of per-cycle-based failure logging.

FIG. 5 shows an exemplary embodiment of per-cycle-based failure logging. This figure illustrates the shift out cycles of three scan chains (scan_out0, scan_out1 and scan_out2), which can be obtained from multiple tester channels. In FIG. 5, the shift out cycles of each of the chains (represented by squares) are shown in rows 502, 504, 506 next to the name of the respective scan chain. Scan chains scan_out0, scan_out1 and scan_out2 respectively comprise 8, 5 and 6 scan cells. In this figure, the right-most squares of rows 502, 504, 506 correspond to cycle 0 for their respective scan chains. Shift out cycles from passing cells are shown with white fill (e.g., cell 520), while shift out cycles from failing cells are shown with black fill (e.g., cell 522). In the shown embodiment, cycles 1, 2 and 3 (highlighted by loops 510, 512 and 514) have one or more shift out cycles from failing cells. Each of theses cycles also has at least one shift cycle from a passing cell.

FIG. 5 also shows an exemplary cycle based failure buffer 530. In per-cycle-based failure logging, there is usually a central failure buffer memory. For a cycle resulting in at least one failing cell, the entire cycle (including information regarding passing cells) is stored in the failure buffer memory. For example, section 532 of the failure buffer 530 stores (for cycle 1) indications that the cell in scan_out1 failed (indicated in this example by bold text) and that cells from scan_out0 and scan_out2 passed (indicated in this example by plain text). Sections 534, 536 likewise record information regarding both passing and failing cells. This can result in inefficient use of a failure buffer memory. If, for example, the failure buffer of the embodiment of FIG. 5 has enough capacity to store data for 6 cells (which, in the example of FIG. 5, would be 2 cycles of data), then the failure buffer will not be able to store failing cycle 3 (i.e., the data of section 536). In some embodiments, when failures are reported externally of the ATE, only failing cell information is reported (even though at least some passing cell information was also recorded).

Figure 6:
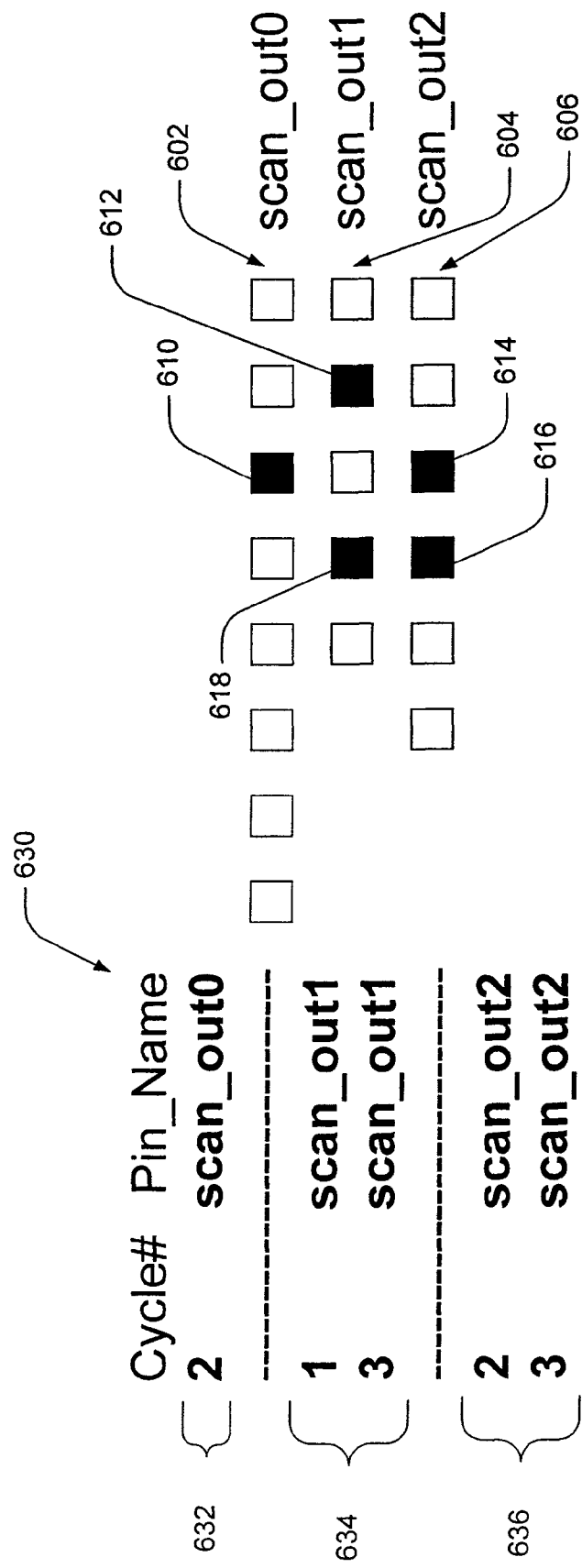
FIG. 6 shows an example of per-pin-based failure logging.

FIG. 6 shows an exemplary embodiment of per-pin-based failure logging. Generally, in pin-based failure logging, instead of a central failure buffer for multiple pins, each pin contains its own buffer and only failures for a pin are stored. Similarly to FIG. 5, in FIG. 6, the shift out cycles of each of the chains (represented by squares) are shown in rows 602, 604, 606 next to the name of the respective scan chain. Scan chains scan_out0, scan_out1 and scan_out2 respectively comprise 8, 5 and 6 scan cells. In this figure, the right-most squares of rows 602, 604, 606 correspond to cycle 0 for their respective scan chains. Shift out cycles from passing cells are shown with white fill, while shift out cycles from failing cells are shown with black fill. In the shown embodiment, cycles 1, 2 and 3 have one or more shift out cycles from failing cells (i.e., cycles 610, 621, 614, 616, 618). In this example, the shift cycles of FIG. 6 are the same as those in FIG. 5. A failure buffer 630 can be partitioned into individual pin buffers (e.g., one for each of the pins scan_out0, scan_out 1 and scan_out2), with each pin buffer having enough capacity to store information for two failing cells. As seen in sections 632, 634, 636 of the failure buffer 630, failing cycles are stored in the buffer (as indicated by the bold text), while passing cycles are not stored. Accordingly, potentially more failing cycles can be stored in the failure buffer 630 than in the failure buffer 530.

Some exemplary methods of the disclosed technology can take advantage of the non-uniform information distribution in fail logs. In some embodiments of the disclosed technology, dynamic per-pin based masking on ATE is performed to selectively log the failure cycles from good chains or POs and to intentionally ignore the failure cycles from faulty chains after a certain number of failure cycles from the chains has been observed. In certain implementations, diagnosis techniques can be modified to incorporate this dynamic per-pin based masking.

In some implementations, ATEs with per-pin based fail buffer architectures are used to perform aspects of the disclosed technology. For example, the Agilent 93K tester (which has a per-pin based fail buffer) can be used. Each pin fail buffer of this exemplary tester can log between 256 cycles and 8K cycles. Further, once a buffer for any pin becomes full, other pins can continue logging failures cycles at other pins. The 93K tester can also determine if a pin's buffer is full.

Using this type of per-pin based fail buffer architecture, it is possible to determine if the failure cycles are truncated at a pin or not. If the failures cycles of a pin are truncated, the last tested pattern at this pin and the last failure cycle associated with the pattern can also be determined. This information is typically added to the fail log.

Using a per-pin-based tester, if, for example, failure cycles are truncated at a pin, an identifier or keyword such as "failure_buffer_limit_reached pin_name pattern_number" can be recorded to indicate the failure buffer is full at a particular pin. If failure cycles are truncated at all pins, an identifier or keyword such as "failure_buffer_limit_reached ALL" can allow for determining the last tested pattern on each pin.

Using a per-cycle-based tester, the log data does not necessarily indicate whether truncation happened or not at a particular pin. In such a log, an identifier or keyword such as "failure_buffer_limit_reached last_cycle" can be used to indicate if the central buffer (for all pins) has become full at the cycle number "last_cycle." Accordingly, the last tested pattern can be determined for the pins.

To incorporate per-pin-based truncation information, diagnostic techniques such as those described below with respect to FIGS. 7 through 10 can be used. In this application, ATEs with per-pin based fail buffer architectures are referred to as "per-pin based ATEs." Such ATEs produce per-pin-based failure logs as described above. ATEs that have one fail buffer for all pins are referred to as "per-cycle based ATEs." Such ATEs produce per-cycle-based failure logs as described above. Further, the exemplary diagnostic techniques disclosed herein are generally referred to as "per-pin based diagnosis," and can take advantage of per-pin based truncation. The disclosed techniques, however, can also be applied to cycle-based failure logs produced by per-cycle based ATEs.

Figure 7:
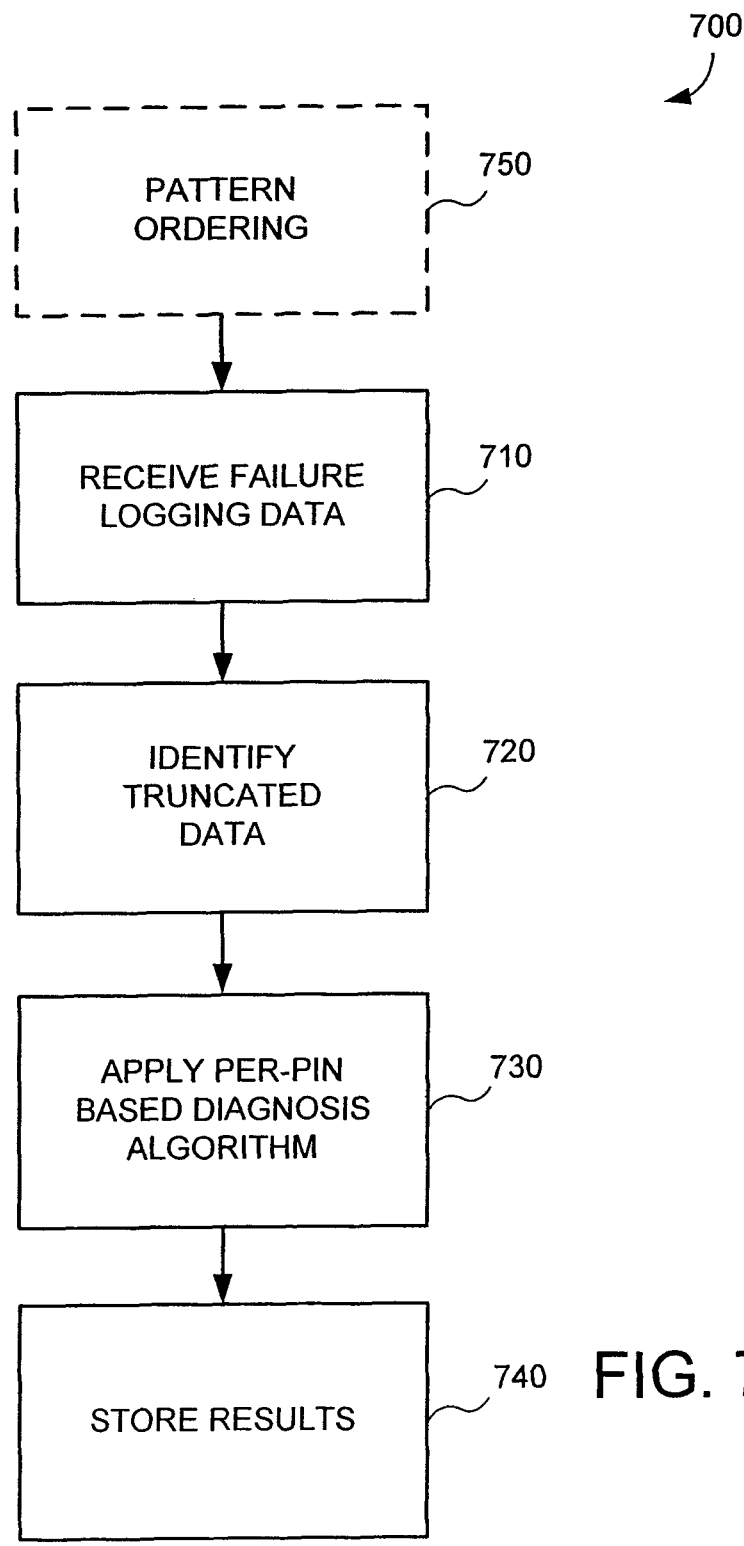
FIG. 7 shows a first exemplary method of per-pin based diagnosis.

FIG. 7 shows one embodiment of a method 700 of per-pin based diagnosis. The method comprises receiving per-pin based failure logging data (method act 710) and identifying truncated data from one or more scan patterns in the logging data (method act 720). In some embodiments, the number of cycles stored in the logging data can be determined at least in part according to user input. A per-pin based diagnosis technique can be applied to the logging data (method act 730). Examples of such diagnosis techniques are described below. The results of applying the diagnosis technique can be stored (method act 740), e.g., in a computer-readable medium. These results can comprise a list of scan cells, including defective scan cells. In further embodiments, storing the results can comprise compressing at least some of the results, while in additional embodiments at least some of the results can remain uncompressed. In some embodiments the failure logging data can be produced from fixed values such as scan patterns ordered according to any of the pattern ordering techniques described above. For example, methods 200, 300 and/or 400 can be used (method act 750).

Figure 8:
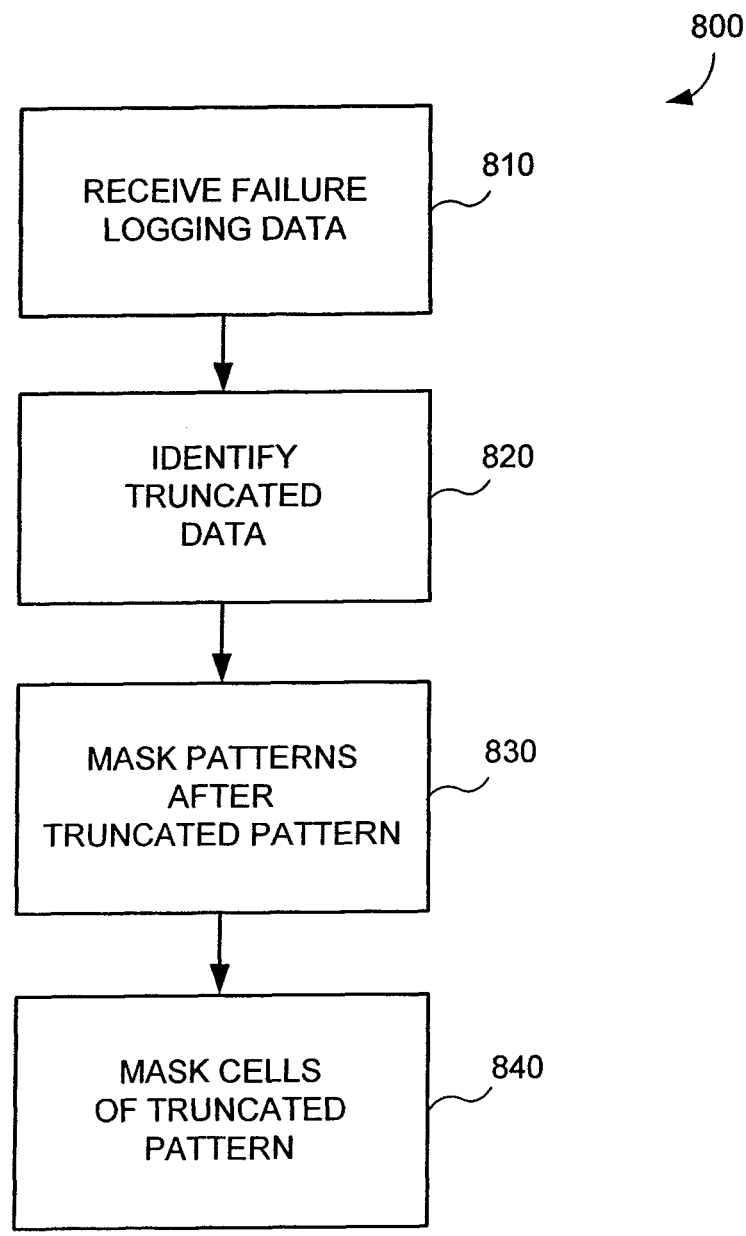
FIG. 8 shows a second exemplary method of per-pin based diagnosis.

FIG. 8 shows method 800, which is one exemplary embodiment of a method of per-pin based diagnosis. In this embodiment, per-pin based failure logging data is received (method act 810) and truncated data from one or more scan patterns is identified (method act 820). In some embodiments, the number of cycles stored in the logging data can be determined at least in part according to user input. During diagnosis, the expected values at a pin where failure cycle truncation has occurred are masked to "X"s for scan patterns applied after the pattern that produced the truncated data (method act 830). For example, for simulations performed during diagnosis (e.g., good machine simulations, faulty machine simulations), the expected values at scan cells associated at the pin where failure cycle truncation has occurred are masked to "X." In some embodiments, for the pattern that produced the truncated data, scan cells between the last observed failure cell for the pattern and the last cell of the chain are masked (method act 840).

Figure 9:
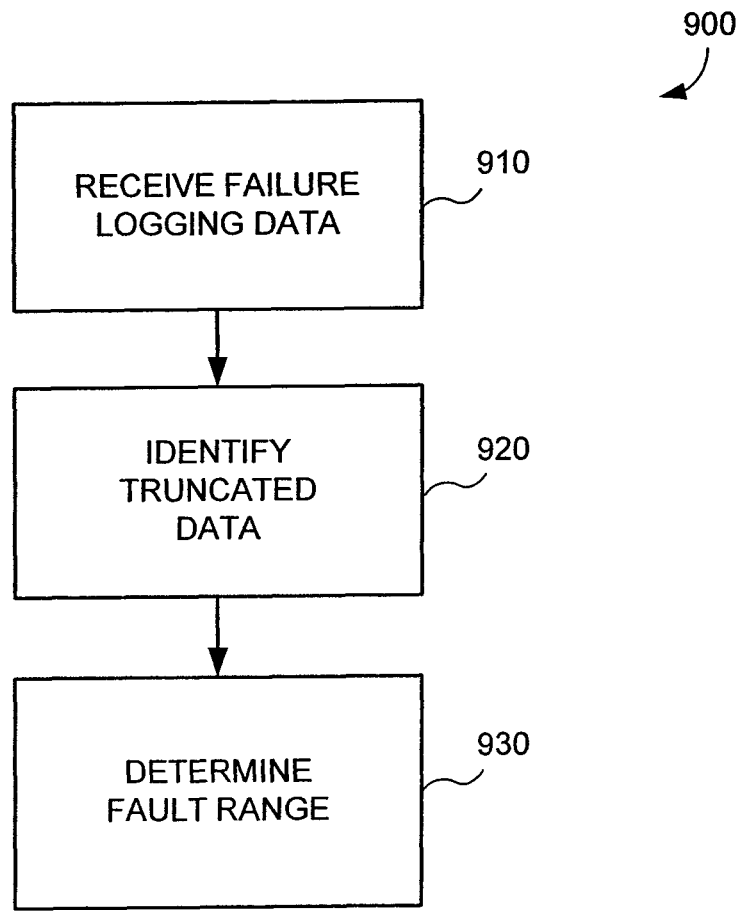
FIG. 9 shows a third exemplary method of per-pin based diagnosis.

FIG. 9 shows a method 900, which is another exemplary embodiment of a method of per-pin based diagnosis. In this embodiment, per-pin based failure logging data is received (method act 910) and truncated data from one or more scan patterns are identified (method act 920). In some embodiments, the number of cycles stored in the logging data can be determined at least in part according to user input. During diagnosis, a range of one or more faulty scan candidates on the scan chain(s) associated with the pin where failure cycle truncation has occurred can be determined based at least in part on the failure logging data (method act 930). For example, the method described above for determining the range of faulty scan candidates (see, e.g., method act 120 of FIG. 1) can be modified to account for truncated failure cycles. For instance, in the chain diagnosis example introduced above, during the range determination (assuming the use of an initial full mask) the loaded values for a faulty chain are set to 12 "X"s. After good machine simulation, the captured values on the faulty chain are "X10XX01X10XX." In this example, it can be assumed also that truncation occurred at this pattern, and that the last failure cycle logged for this pattern is cell 7. If the observed unloaded value at scan cell 6 (simulated capture value is "0") does not show up in the fail log, the permanent stuck-at-1 fault can be determined to be upstream of cell 6. However, if the observed unloaded value at scan cell 9 (simulated capture value is "0") is not shown in the fail log, it cannot be determined that the fault is upstream of cell 9. Instead, as a consequence of the truncation, it is not known if cell 9 correctly unloaded or not. Therefore, the range of the stuck-at-1 fault becomes [11, 6]. Further, in certain embodiments, when the simulated values are compared with the observed values, comparisons of patterns or cycles at a particular pin can be ignored if the patterns and the cycles are truncated at this pin. Moreover, as discussed above with respect to FIG. 1, the range finding technique can be performed iteratively in order to enhance the range calculation and possibly identify the failing scan cell.

Embodiments of the scan pattern masking technique in FIG. 8 can be relatively easy to implement. For example, if a given diagnosis technique only calls good machine simulations a small number of times, method 800 can be easily implemented. As is explained below, system logic diagnosis is one example of a diagnosis method that is suitable for use with an embodiment of the pattern-masking technique because system logic diagnosis can rely on faulty machine simulation rather than good machine simulation. Embodiments of the modified diagnostic technique in FIG. 8, by contrast, can be more efficient for a diagnosis that relies heavily on good machine simulation. Chain diagnosis is an example of such a diagnosis method.

In some embodiments, per-pin based diagnosis can be used with logic diagnosis as follows. After receiving indications of one or more failing cycles from a test applied to a logic circuit, these failing cycles can be traced to identify one or more suspect faults in the circuit. If some of the data from the test is truncated, the truncated data can be ignored. As this will generally result in a larger group of initial fault subjects, diagnosis resolution can be relatively low at this point. (This can be compared to chain diagnosis, where truncated data can lead to a relatively large fault range.) When a simulation is run with a fault injected, truncated failure cycles (at one pin or at multiple pins) can be masked to "X"s during the simulation (e.g., in the simulated test responses). This can allow these cycles to be ignored, as it is not known if these cycles would pass or fail if they were to be applied to the tester.

Experimental Results

Below are some exemplary experimental results for some embodiments of the disclosed technology—specifically, for the exemplary static pattern ordering, dynamic pattern ordering, and per-pin based diagnosis embodiments described above. The experiments used to produce the described results used simulated chain diagnosis cases. Specifically, the simulated cases were obtained by using one Fastscan™ design with 8 scan chains. The chain lengths varied from 655-725 cells. ATPG was run to generate 500 scan patterns as production test patterns. Each set of experiments was executed according to the exemplary pseudocode implementation shown in FIG. 10. A fixed cycle limit, which was increased from 256 to 8K cycles to emulate the Agilent 93K tester, was used for each run. Specifically, the following limits were set: limit[1]=256, limit[2]=512, limit[3]=1024, limit[4]=2048, limit[5]=3072, limit[6]=4096, limit[7]=5120, limit[8]=6144, limit[9]=7168, limit[10]=8192.

As further seen in FIG. 10, one stuck-at-0 chain fault was injected every 5 scan cells from [0, 650] on each chain. For each run, 131*8=1048 simulated chain failure cases were obtained. Thus, with 10 runs with different cycle limits, 10480 simulated test cases were obtained for each experimental group.

Conventional per-cycle based chain diagnosis was also run on these 10480 test cases. The results from conventional diagnosis are shown in Table 2. Diagnosis accuracy (correctness) was generally not an issue due to limited cycles. Therefore, only the diagnosis resolution is measured, which is defined for purposes of Table 2 as the percentage of diagnosed cases where the reported suspects numbered 3 or less. In some embodiments, if the number of suspect cells is less than or equal to 3, the list of can be useful for failure analysis.

TABLE 2

Exemplary test results obtained using conventional diagnosis

| ATE total cycle limit | # suspects = 1 | # suspects = 2 | # suspects = 3 | Total | Percentage |
|---|---|---|---|---|---|
| 256 | 0 | 0 | 0 | 0 | 0 |
| 512 | 0 | 0 | 0 | 0 | 0 |
| 1K | 5 | 4 | 1 | 10 | 0.95% |
| 2K | 93 | 75 | 29 | 197 | 18.8% |
| 3K | 151 | 149 | 26 | 326 | 31.1% |
| 4K | 182 | 151 | 25 | 358 | 34.2% |
| 5K | 189 | 150 | 24 | 363 | 34.6% |
| 6K | 199 | 149 | 24 | 372 | 35.5% |
| 7K | 204 | 152 | 25 | 381 | 36.4% |
| 8K | 214 | 153 | 25 | 392 | 37.4% |

Exemplary Experimental Results Using Static Pattern Ordering

Using the exemplary embodiment of the static pattern re-ordering technique described above (see, e.g., FIG. 3), patterns with relatively high diagnosabilities for chains were moved toward the front of the pattern. Experimental results from the exemplary technique are shown in Table 3.

TABLE 3

Exemplary test results for cycle-limited per-cycle chain diagnosis ordering after static pattern ordering

| ATE total cycle limit | # suspects = 1 | # suspects = 2 | # suspects = 3 | Total | Percentage |
|---|---|---|---|---|---|
| 256 | 0 | 0 | 0 | 0 | 0 |
| 512 | 0 | 0 | 0 | 0 | 0 |
| 1K | 11 | 8 | 4 | 23 | 2.2% |
| 2K | 102 | 84 | 37 | 223 | 21.3% |
| 3K | 162 | 154 | 24 | 340 | 32.4% |
| 4K | 191 | 160 | 24 | 375 | 35.8% |
| 5K | 197 | 166 | 25 | 388 | 37.0% |
| 6K | 203 | 165 | 24 | 392 | 37.4% |
| 7K | 215 | 166 | 25 | 406 | 38.7% |
| 8K | 222 | 166 | 25 | 413 | 39.4% |

Figure 11:
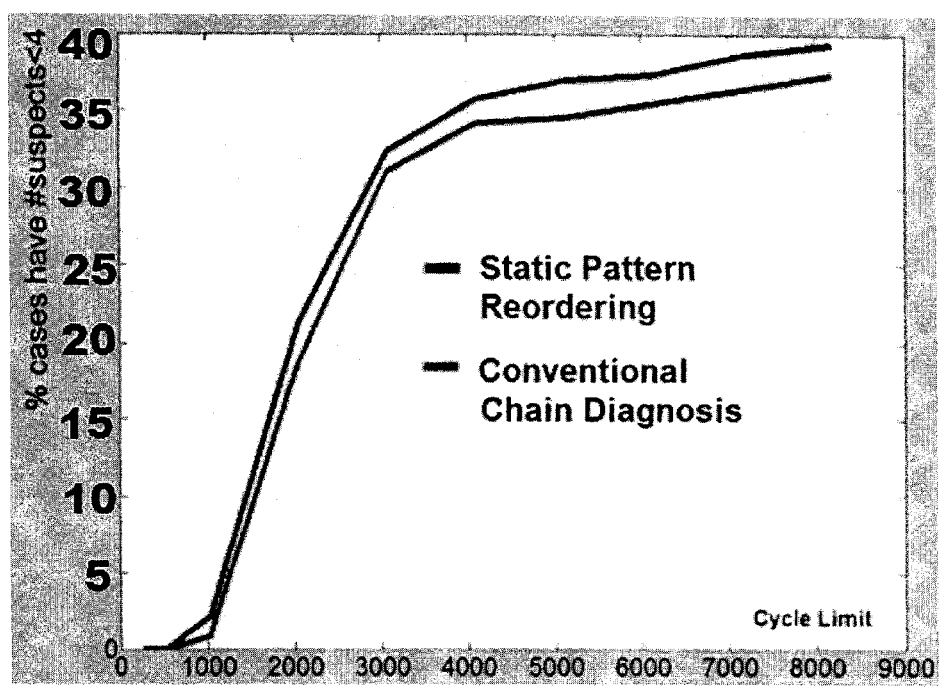
FIG. 11 is a graph of exemplary experimental results involving static pattern ordering diagnosis and conventional diagnosis.

FIG. 11 is a graph of the percentage (as a function of cycle limit) of diagnosed cases having 3 or fewer suspects for both static pattern ordering diagnosis and conventional diagnosis. This graph shows that by using the exemplary static pattern ordering technique, diagnosis resolution was enhanced for these test results compared to conventional per-chain diagnosis.

Exemplary Experimental Results Using Dynamic Pattern Ordering

Using the exemplary embodiment of the dynamic pattern re-ordering technique described above (see, e.g., FIG. 4), patterns with high diagnosabilities for the targeted faulty chain were moved toward the front of the pattern set. Experimental results from application of the exemplary technique are shown in Table 4.

TABLE 4

Exemplary test results for cycle-limited per-cycle chain diagnosis ordering after dynamic pattern ordering.

| ATE total cycle limit | # suspects = 1 | # suspects = 2 | # suspects = 3 | Total | Percentage |
|---|---|---|---|---|---|
| 256 | 0 | 0 | 0 | 0 | 0 |
| 512 | 0 | 0 | 0 | 0 | 0 |
| 1K | 14 | 10 | 5 | 29 | 2.8% |
| 2K | 109 | 91 | 39 | 239 | 22.8% |
| 3K | 168 | 159 | 26 | 353 | 33.7% |
| 4K | 194 | 161 | 24 | 379 | 36.2% |
| 5K | 199 | 168 | 25 | 392 | 37.4% |
| 6K | 206 | 166 | 25 | 397 | 37.9% |
| 7K | 220 | 165 | 24 | 409 | 39.0% |
| 8K | 225 | 166 | 25 | 416 | 39.7% |

Figure 12:
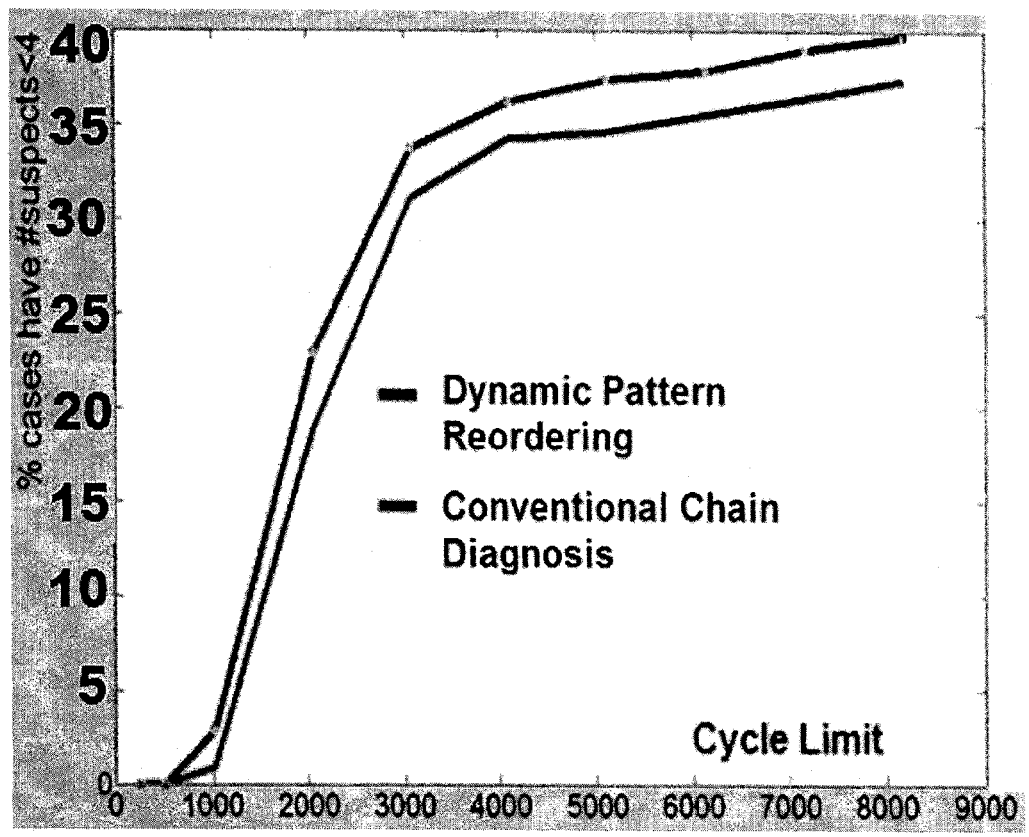
FIG. 12 is a graph of exemplary experimental results involving dynamic pattern ordering diagnosis and conventional diagnosis.

FIG. 12 is a graph of the percentage (as a function of cycle limit) of diagnosed cases having 3 or fewer suspects for both dynamic pattern ordering diagnosis and conventional diagnosis. This graph shows that by using the exemplary dynamic pattern ordering technique, diagnosis resolution was enhanced for these test results compared to conventional per-chain diagnosis. Comparing Tables 3 and 4, it can be observed that dynamic pattern ordering was slightly better than static pattern ordering. However, neither method produced a large number of suspects when the cycle limit was very low (e.g., 256 or 512 cycles). When the cycle limit is very small, for instance, it may not be possible to log even one complete set of failing cycles from a failing pattern.

Per-Pin Based Diagnosis

In Table 5, the results of simulating the exemplary embodiment of the per-pin based chain diagnosis described above (see, e.g., FIGS. 7-9) with limited failure cycles are shown.

TABLE 5

Exemplary test results for cycle-limited per-pin based chain diagnosis

| ATE total cycle limit | # suspects = 1 | # suspects = 2 | # suspects = 3 | Total | Percentage |
|---|---|---|---|---|---|
| 256 | 87 | 79 | 21 | 187 | 17.8% |
| 512 | 95 | 89 | 31 | 215 | 20.5% |
| 1K | 101 | 93 | 29 | 223 | 21.3% |
| 2K | 181 | 141 | 44 | 366 | 34.9% |
| 3K | 211 | 191 | 34 | 436 | 41.6% |
| 4K | 232 | 187 | 36 | 455 | 43.4% |
| 5K | 243 | 188 | 35 | 466 | 44.5% |
| 6K | 245 | 188 | 35 | 468 | 44.7% |
| 7K | 250 | 191 | 35 | 476 | 45.4% |
| 8K | 260 | 189 | 37 | 486 | 46.4% |

Figure 13:
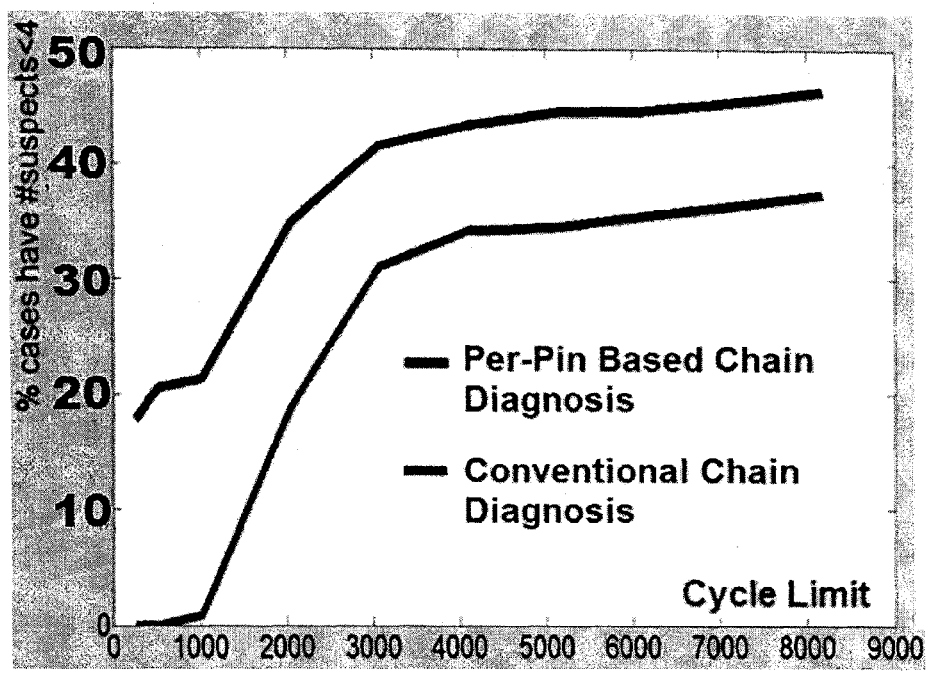
FIG. 13 is a graph of exemplary experimental results involving per-pin based diagnosis and per-cycle based diagnosis.

FIG. 13 is a graph of the percentage (as a function of cycle limit) of diagnosed cases having 3 or fewer suspects for both per-pin based diagnosis and per-cycle based diagnosis. FIG. 13 shows that by using the proposed per-pin based chain diagnosis, diagnosis resolution can be enhanced, for example, when the failure cycle limit is very small (e.g., less than 1K cycles). In the volume production environment, the failure cycle limit can be very small. Therefore, by using per-pin-based ATEs and embodiments of the disclosed per-pin-based diagnosis techniques, it can be more feasible to perform volume diagnosis.

In the experiments reported above, all failure cycles were logged for the chain patterns. As noted above, however, a subset of the failure cycles from chain patterns can often be enough to determine the faulty chain(s) and fault models. In experiments described below, only the first 12 cells in the design are observed, thereby producing more space to log additional scan failure cycles from other chain patterns. Table 6 and Table 7 show the experimental results using this partial chain approach for conventional per-cycle based chain diagnosis and for an exemplary embodiment of the per-pin based chain diagnosis technique.

TABLE 6

Exemplary test results for conventional per-cycle based chain diagnosis (observing only the first 12 cells in a chain pattern)

| ATE total cycle limit | # suspects = 1 | # suspects = 2 | # suspects = 3 | Total | Percentage |
|---|---|---|---|---|---|
| 256 | 0 | 0 | 0 | 0 | 0 |
| 512 | 0 | 0 | 0 | 0 | 0 |
| 1K | 5 | 5 | 2 | 12 | 1.1% |
| 2K | 118 | 121 | 25 | 264 | 25.1% |
| 3K | 178 | 148 | 25 | 351 | 33.5% |
| 4K | 182 | 151 | 25 | 358 | 34.2% |
| 5K | 199 | 149 | 23 | 371 | 35.4% |
| 6K | 200 | 149 | 25 | 374 | 35.7% |
| 7K | 210 | 153 | 25 | 388 | 37.0% |
| 8K | 216 | 153 | 24 | 393 | 37.5% |

Comparing Tables 2 and 6, it can be observed that the conventional per-cycle based diagnosis can be improved slightly by logging partial chain pattern failing cycles.

TABLE 7

Exemplary test results for per-pin based chain diagnosis (observing only the first 12 cells in a chain pattern)

| ATE total cycle limit | # suspects = 1 | # suspects = 2 | # suspects = 3 | Total | Percentage |
|---|---|---|---|---|---|
| 256 | 87 | 79 | 21 | 187 | 17.8% |
| 512 | 95 | 89 | 31 | 215 | 20.5% |
| 1K | 101 | 93 | 29 | 223 | 21.3% |
| 2K | 195 | 173 | 36 | 404 | 38.5% |
| 3K | 231 | 188 | 35 | 454 | 43.3% |
| 4K | 232 | 187 | 36 | 455 | 43.4% |
| 5K | 245 | 187 | 35 | 467 | 44.6% |
| 6K | 246 | 187 | 35 | 468 | 44.7% |
| 7K | 255 | 192 | 35 | 482 | 46.0% |
| 8K | 260 | 190 | 37 | 487 | 46.5% |

Comparing Tables 5 and 7, it can be observed that the diagnosis resolution from the exemplary embodiment of the per-pin based chain diagnosis technique when logging partial chain failure cycles is quite close to the diagnosis resolution when logging all chain failure cycles. This is because the diagnosis resolution of per-pin based chain diagnosis is largely determined by the number of logged failure cycles on good chains and POs.

Additional Considerations

In general, embodiments of the static pattern ordering technique are relatively easy to implement and can help enhance diagnosis resolution. However, in some embodiments the technique is not desirable for a volume production environment because of its possible impact on the production test. If only a subset of patterns can be applied (e.g., due to the ATE memory limit), the original production pattern order can sometimes achieve higher fault coverage than the ordered pattern set. The logging efficiency of the technique can also be undesirable because, in some embodiments, the best diagnostic partitions for a specific chain fault on a given chain can be positioned deeper into the pattern set than for another chain.

In general, embodiments of the dynamic pattern ordering technique have better logging efficiency and can enhance diagnosis resolution. In certain situations, however, the technique can be difficult to implement on ATE because the technique typically uses the ATE to perform some adaptive test program control. As above, some embodiments of the method can also have an undesirable impact on production test due to ATE memory limitations. These exemplary methods can also be undesirable for volume diagnosis when the fail buffer limit is very low. Nevertheless, in the failure analysis lab, when a per-pin based tester is not available, these exemplary methods can exhibit better diagnosis resolution than conventional approaches.

By contrast, at least some described embodiments of the per-pin based diagnosis technique do not have any impact on the production test. Further, high logging efficiency can be achieved using embodiments of the technique by logging many failing cycles on good chains and POs and ignoring a large number of redundant failing cycles on faulty chains.

A Case Study

To analyze the performance of the exemplary embodiment of the per-pin based chain diagnosis technique described above, the technique was applied in a volume production test of an industrial design with about 10M gates and 100 scan chains, where each chain had more than 10K scan cells. The testing used a tester having a per-pin based architecture. In Table 8, the case study diagnosis results for per-cycle based diagnosis are compared with results for per-pin based diagnosis on about 120 failing chips with defective scan chains.

TABLE 8

Case study results

| | Per-cycle based diagnosis | Per-pin based diagnosis |
| --- | --- | --- |
| # suspects = 1 | 1% | 24% |
| # suspects = 2 | 2.3% | 1.3% |
| # Score = 100 AND # suspects = 1 or 2 | 0 | 22.8% |

In practice, if the number of reported suspect cells is more than 2, physical failure analysis can be difficult since it can require tracing a large amount of silicon. Accordingly, Table 8 reports cases with 1 or 2 suspect cells. From Table 8, it can be seen that with per-cycle based diagnosis, only a total of 3.3% cases reported one or two suspects, while with per-pin based diagnosis a total of 25.3% cases reported one or two suspects. Moreover, among the useful cases, 22.8% of the failing chips diagnosed had a score of 100, which means the diagnosis simulation and ATE observation were matched.

Although chain diagnosis is used for examples in this application, at least some embodiments of the described technologies can also be applied to system logic diagnosis when fail buffer limit is a concern.

Exemplary Computing Environment

Figure 14:
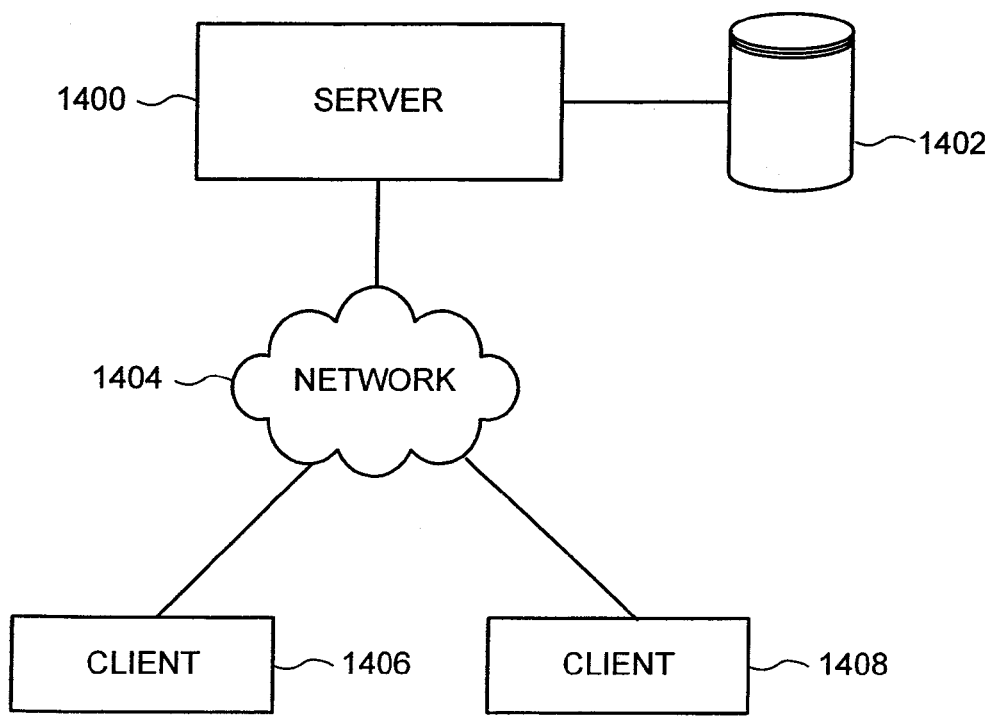
FIG. 14 is a diagram illustrating an exemplary client-server network environment.

Any of the aspects of the technology described above can be performed or designed using a distributed computer network. FIG. 14 shows one such exemplary network. A server computer 1400 can have an associated storage device 1402 (internal or external to the server computer). For example, the server computer 1400 can be configured to process EDA information related to electronic designs using any of the embodiments described above (e.g., as part of an EDA tool). The server computer 1400 can be coupled to a network, shown generally at 1404, which can comprise, for example, a wide-area network, a local-area network, a client-server network, the Internet, or other such network. One or more client computers, such as those shown at 1406, 1408, can be coupled to the network 1404 using a network protocol.

Figure 15:
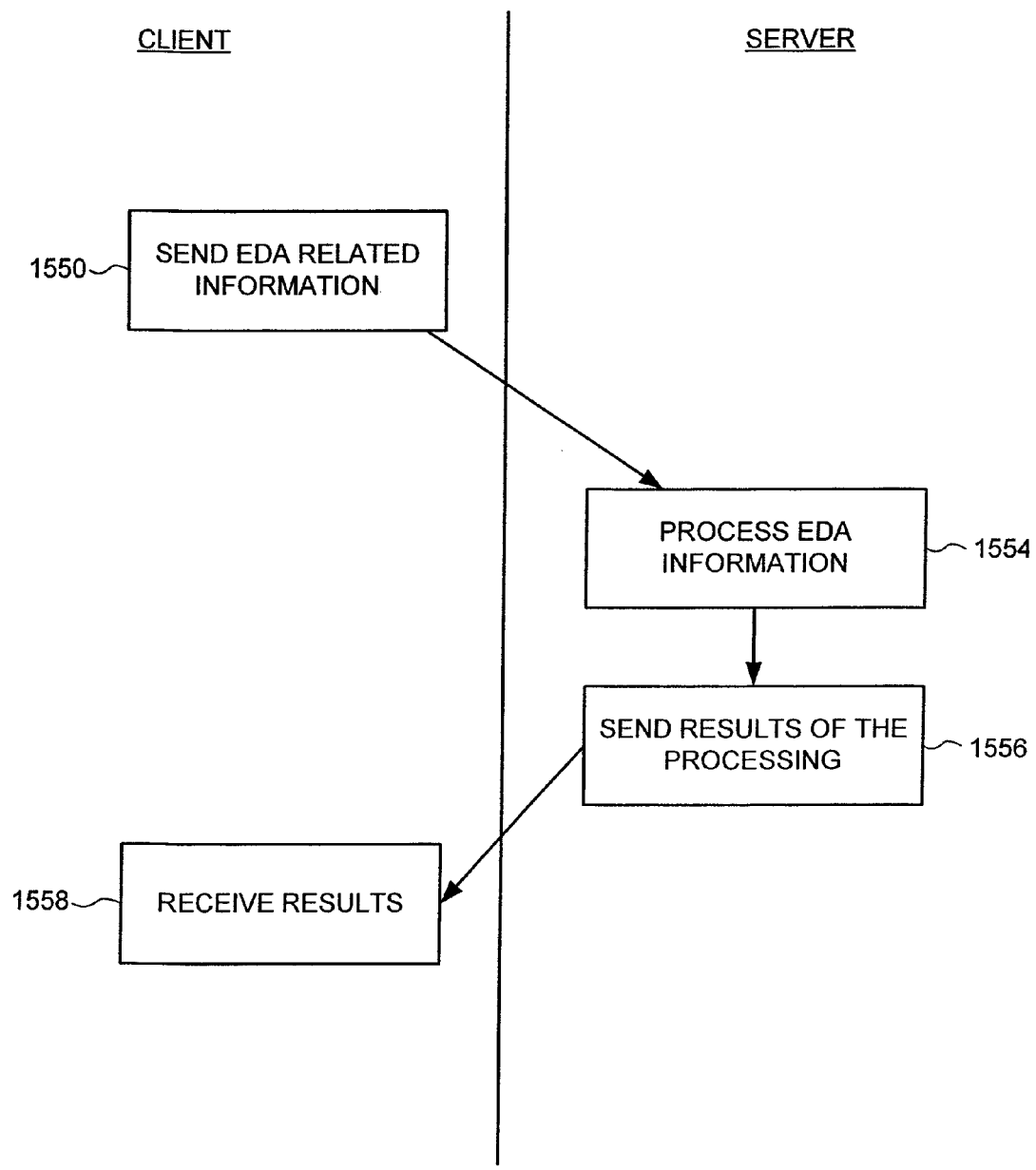
FIG. 15 is a diagram illustrating an exemplary method of performing an embodiment of the disclosed technology using a client-server network, such as the one illustrated in FIG. 14.

FIG. 15 shows one embodiment in which a client computer (e.g., computers 1406 and 1408 of FIG. 14) can receive results (e.g., test information) related to processing EDA related information (e.g., test information) according to any of the embodiments disclosed herein using a remote server computer, such as the server computer 1400 shown in FIG. 14. In method act 1550, for example, a client computer sends data related to EDA. For instance, a client computer can send pattern set, one or more proposed IC design layouts and other EDA information from a design database. In method act 1554, the data is received by the server computer and processed according to any of the disclosed embodiments (e.g., tests are performed). In method act 1556, the server computer sends the results (e.g., test information) to the client computer, which receives the results in method act 1558.

Having illustrated and described the principles of the illustrated embodiments, it will be apparent to those skilled in the art that the embodiments can be modified in arrangement and detail without departing from such principles. In view of the many possible embodiments, it will be recognized that the illustrated embodiments include only examples and should not be taken as a limitation on the scope of the invention. Rather, the invention is defined by the following claims and their equivalents. We therefore claim as the invention all such embodiments and equivalents that come within the scope of these claims.

We claim:

1. A method for an electronic circuit design, the design comprising one or more scan chains with a plurality of scan cells, the method comprising:
   receiving one or more coverage scores for one or more of the scan cells, the coverage scores being associated with one or more scan patterns;
   determining, according to the one or more coverage scores, a diagnosis coverage figure for at least one scan chain of the one or more scan chains in relation to the one or more scan patterns, wherein the diagnosis coverage figure indicates a likelihood of detecting scan chain defects in the at least one scan chain using the one or more scan patterns; and
   storing the diagnosis coverage figure.

2. The method of claim 1, further comprising ordering at least some of the scan patterns according to their respective diagnosis coverage figures.

3. The method of claim 2, further comprising:
   loading at least some of the scan patterns into the one or more scan chains; and
   testing the one or more scan chains using the loaded patterns.

4. The method of claim 3, further comprising providing results of the testing to a per-pin based tester.

5. The method of claim 3, further comprising providing results of the testing to a per-cycle based tester.

6. The method of claim 1, further comprising identifying one or more failing scan chains and thereafter determining one or more diagnostic coverage figures for the failing scan chains.

7. The method of claim 1, wherein determining one or more diagnosis coverage figures comprises averaging two or more of the coverage scores.

8. The method of claim 1, wherein the at least one scan chain comprises a first scan chain with a first plurality of scan cells and a second scan chain with a second plurality of scan cells, wherein the coverage scores are for at least one scan cell of the first plurality of scan cells and at least one scan cell of the second plurality of scan cells, and wherein the diagnosis coverage score is determined for both the first scan chain and the second scan chain.

9. A method for an electronic circuit design, the design comprising one or more system logic sections, the method comprising:
   determining one or more diagnosis coverage figures for one or more test patterns in a set of test patterns, wherein the diagnosis coverage figure is based at least in part on a number of fault pairs in the one or more system logic sections distinguished by the one or more patterns;
   ordering at least some of the patterns based at least in part on the one or more diagnosis coverage figures; and
   storing the ordered patterns.

10. The method of claim 9, wherein the number of fault pairs distinguished by the one or more patterns is a number of suspect fault pairs in the one or more system logic sections distinguished by the one or more patterns.

11. One or more computer-readable storage media having encoded thereon instructions which, when executed by a computer, cause the computer to perform a method for an electronic circuit design, the design comprising one or more scan chains with a plurality of scan cells, the method comprising:
   receiving one or more coverage scores for one or more of the scan cells, the coverage scores being associated with one or more scan patterns; and
   determining, according to the one or more coverage scores, a diagnosis coverage figure for at least one scan chain of the one or more scan chains in relation to the one or more scan patterns, wherein the diagnosis coverage figure indicates a likelihood of detecting scan chain defects in the at least one scan chain using the one or more scan patterns.

12. The one or more computer-readable storage media of claim 11, the method further comprising ordering at least some of the scan patterns according to their respective diagnosis coverage figures.

13. The one or more computer-readable storage media of claim 12, the method further comprising:
   loading at least some of the scan patterns into the one or more scan chains; and
   testing the one or more scan chains using the loaded patterns.

14. The one or more computer-readable storage media of claim 13, the method further comprising providing results of the testing to a per-pin based tester.

15. The one or more computer-readable storage media of claim 13, the method further comprising providing results of the testing to a per-cycle based tester.

16. The one or more computer-readable storage media of claim 11, the method further comprising identifying one or more failing scan chains and thereafter determining one or more diagnostic coverage figures for the failing scan chains.

17. The one or more computer-readable storage media of claim 11, wherein determining one or more diagnosis coverage figures comprises averaging two or more of the coverage scores.

18. The one or more computer-readable storage media of claim 11, wherein the at least one scan chain comprises a first scan chain with a first plurality of scan cells and a second scan chain with a second plurality of scan cells, wherein the coverage scores are for at least one scan cell of the first plurality of scan cells and at least one scan cell of the second plurality of scan cells, and wherein the diagnosis coverage score is determined for both the first scan chain and the second scan chain.

19. One or more computer-readable storage media having encoded thereon instructions which, when executed by a computer, cause the computer to perform a method for an electronic circuit design, the design comprising one or more system logic sections, the method comprising:
   determining one or more diagnosis coverage figures for one or more test patterns in a set of test patterns, wherein the diagnosis coverage figure is based at least in part on a number of fault pairs in the one or more system logic sections distinguished by the one or more patterns; and
   ordering at least some of the patterns based at least in part on the one or more diagnosis coverage figures.

20. The one or more computer-readable storage media of claim 19, wherein the number of fault pairs distinguished by the one or more patterns is a number of suspect fault pairs in the one or more system logic sections distinguished by the one or more patterns.

* * * * *